(12) United States Patent
Grace et al.

(10) Patent No.: US 6,727,970 B2
(45) Date of Patent: Apr. 27, 2004

(54) METHOD OF MAKING A HYBRID DISPLAY DEVICE HAVING A RIGID SUBSTRATE AND A FLEXIBLE SUBSTRATE

(75) Inventors: Anthony J. Grace, Long Beach, CA (US); Kieran F. Drain, Newhall, CA (US); Yukihiko Sasaki, Claremont, CA (US)

(73) Assignee: Avery Dennison Corporation, Pasadena, CA (US)

( * ) Notice: Subject to any disclaimer, the term of this patent is extended or adjusted under 35 U.S.C. 154(b) by 103 days.

(21) Appl. No.: 09/961,840

(22) Filed: Sep. 24, 2001

(65) Prior Publication Data

US 2002/0196386 A1 Dec. 26, 2002

Related U.S. Application Data

(60) Provisional application No. 60/300,682, filed on Jun. 25, 2001.

(51) Int. Cl.[7] .................. G02F 1/13; G02F 1/1333; G02F 1/1339; G03F 9/00
(52) U.S. Cl. .............. 349/187; 349/158; 349/155; 430/7
(58) Field of Search .................. 349/158, 187, 349/189, 190, 106, 156, 155; 430/7

(56) References Cited

U.S. PATENT DOCUMENTS

| | | | |
|---|---|---|---|
| 4,221,533 A | 9/1980 | Heim et al. ............ 414/744 |
| 4,460,449 A | 7/1984 | Montalbano ............ 204/281 |
| 4,478,769 A | 10/1984 | Pricone et al. ............ 264/1.4 |
| 4,486,363 A | 12/1984 | Pricone et al. ............ 264/1.4 |
| 4,601,861 A | 7/1986 | Pricone et al. ............ 264/1.6 |
| 4,664,591 A | 5/1987 | Faes et al. ............ 414/753 |
| 4,970,366 A | 11/1990 | Imatou et al. ............ 219/121.68 |
| 5,069,533 A * | 12/1991 | Yuasa et al. ............ 349/191 |
| 5,153,983 A | 10/1992 | Oyama ............ 29/740 |
| 5,156,863 A | 10/1992 | Pricone et al. ............ 425/363 |
| 5,231,329 A * | 7/1993 | Nishikitani et al. ............ 313/503 |
| 5,399,502 A | 3/1995 | Friend et al. ............ 437/1 |
| 5,455,733 A | 10/1995 | Waggamon ............ 361/115 |
| 5,564,888 A | 10/1996 | Doan ............ 414/751 |
| 5,635,307 A | 6/1997 | Takeuchi et al. ............ 428/690 |
| 5,667,853 A | 9/1997 | Fukuyoshi et al. ............ 428/1 |
| 5,703,436 A | 12/1997 | Forrest et al. ............ 313/506 |
| 5,714,404 A | 2/1998 | Mitlitsky et al. ............ 437/233 |
| 5,733,615 A | 3/1998 | Rackovan et al. ............ 428/35.7 |
| 5,747,182 A | 5/1998 | Friend et al. ............ 428/690 |

(List continued on next page.)

FOREIGN PATENT DOCUMENTS

| | | |
|---|---|---|
| EP | 0 699 375 B1 | 1/1995 |
| JP | 02-210417 A * | 8/1990 |
| WO | WO 99/08151 | 2/1999 |
| WO | WO 99/36261 | 7/1999 |
| WO | WO 00/49658 | 1/2000 |
| WO | WO 00/41884 | 7/2000 |

(List continued on next page.)

Primary Examiner—Tarifur R. Chowdhury
(74) Attorney, Agent, or Firm—Renner, Otto, Boisselle & Sklar, LLP

(57) ABSTRACT

A display includes a front panel and a back panel with a light control material in between. One of the panels includes a rigid substrate, for example made of glass or rigid plastic. The other of the panels includes a flexible substrate, for example made of a flexible plastic film. The panel with the flexible substrate may be made by a roll-to-roll process, with various fabrication operations formed while the flexible substrate is still part of a web of material. The panel with the rigid substrate may be separately fabricated, then combined with the other panel on the web through a pick and place operation that accurately locates the front panel relative to the back panel. The display may be any of a variety of displays, such as liquid crystal displays (LCDs), and electroluminescent displays, such as polymer light emitting devices (PLEDs) and organic light emitting devices (OLEDs).

70 Claims, 11 Drawing Sheets

U.S. PATENT DOCUMENTS

| | | | | |
|---|---|---|---|---|
| 5,757,456 A | * | 5/1998 | Yamazaki et al. | 349/151 |
| 5,790,244 A | | 8/1998 | Dunne | 356/5.01 |
| 5,798,170 A | | 8/1998 | Zhang et al. | 428/212 |
| 5,817,550 A | | 10/1998 | Carey et al. | 438/166 |
| 5,856,858 A | | 1/1999 | Carey et al. | 349/158 |
| 5,882,806 A | | 3/1999 | Mori | 428/690 |
| 5,889,084 A | | 3/1999 | Roth | 523/161 |
| 5,889,566 A | | 3/1999 | Wu et al. | 349/35 |
| 5,891,520 A | | 4/1999 | Makar et al. | 427/269 |
| 5,900,327 A | | 5/1999 | Pei et al. | 428/690 |
| 5,929,194 A | | 7/1999 | Woo et al. | 528/229 |
| 5,929,562 A | | 7/1999 | Pichler | 313/506 |
| 5,946,837 A | | 9/1999 | Ackers | 40/558 |
| 5,962,631 A | | 10/1999 | Woo et al. | 528/397 |
| 5,965,280 A | | 10/1999 | Roitman et al. | 428/690 |
| 5,965,281 A | | 10/1999 | Cao | 428/690 |
| 5,973,844 A | | 10/1999 | Burger | 359/622 |
| 5,986,401 A | | 11/1999 | Thompson et al. | 313/504 |
| 6,004,682 A | | 12/1999 | Rackovan et al. | 428/518 |
| 6,004,685 A | | 12/1999 | Antoniadis et al. | 428/690 |
| 6,030,715 A | | 2/2000 | Thompson et al. | 428/690 |
| 6,136,444 A | | 10/2000 | Kon et al. | 428/423.1 |
| 6,140,009 A | | 10/2000 | Wolk et al. | 430/200 |
| 6,145,901 A | | 11/2000 | Rich | 294/64.1 |
| 6,150,043 A | | 11/2000 | Thompson et al. | 428/690 |
| 6,150,668 A | | 11/2000 | Bao et al. | 257/40 |
| 6,194,119 B1 | | 2/2001 | Wolk et al. | 430/200 |
| 6,214,520 B1 | | 4/2001 | Wolk et al. | 430/273.1 |
| 6,459,467 B1 | * | 10/2002 | Hashimoto et al. | 349/153 |
| 2002/0027625 A1 | * | 3/2002 | Nishi et al. | 349/106 |

FOREIGN PATENT DOCUMENTS

| | | |
|---|---|---|
| WO | WO 00/46854 | 8/2000 |
| WO | WO 00/49421 | 8/2000 |
| WO | WO 00/55915 | 9/2000 |
| WO | WO 00/55916 | 9/2000 |

* cited by examiner

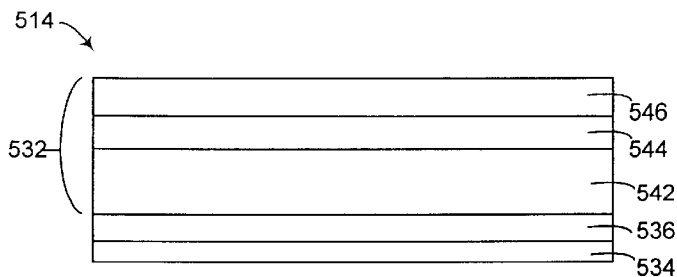
Fig. 14
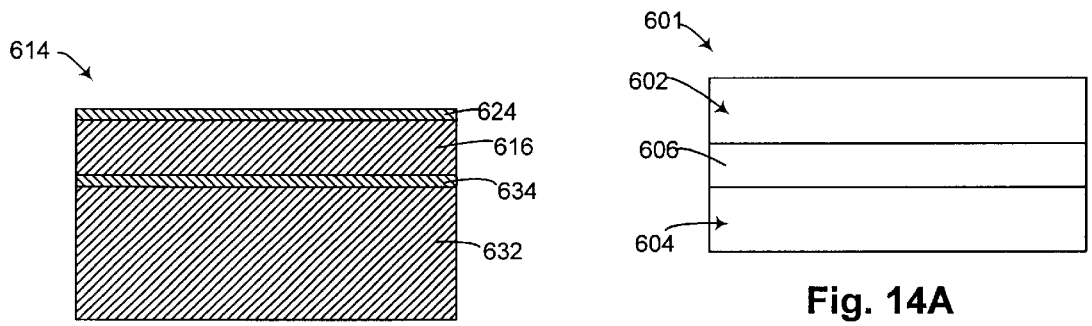
Fig. 15
Fig. 14A
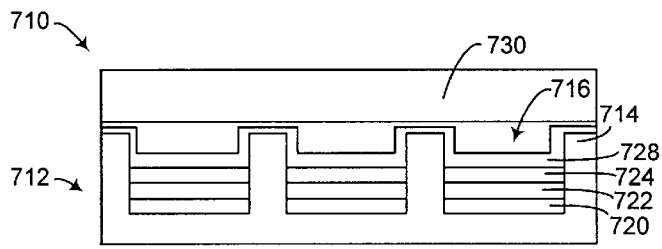
Fig. 16
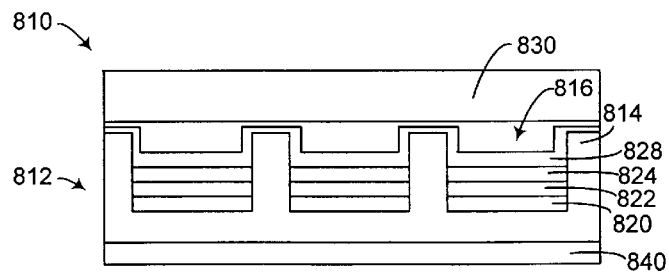
Fig. 17

METHOD OF MAKING A HYBRID DISPLAY DEVICE HAVING A RIGID SUBSTRATE AND A FLEXIBLE SUBSTRATE

This application claims the benefit of U.S. Provisional Application No. 60/300,682, filed Jun. 25, 2001, which is incorporated by reference in its entirety.

BACKGROUND OF THE INVENTION

1. Technical Field of the Invention

The invention relates to optical display devices, and to methods for making the same.

2. Background of the Related Art

Liquid crystal display (LCD) devices are one example of well-known display devices that are useful in a number of applications where light weight, low power and a flat panel display are desired. Typically, these devices comprise a pair of sheet-like, glass substrate elements or "half-cells" overlying one another with liquid crystal material confined between the glass substrates. The substrates are sealed at their periphery with a sealant to form the cell or device. Transparent electrodes are generally applied to the interior surface of the substrates to allow the application of an electric field at various points on the substrates thereby forming addressable pixel areas on the display.

Various types of liquid crystal materials are known in the art and are useful in devices referred to as twisted nematic (TN), super twisted nematic (STN), cholesteric, and ferroelectric display devices.

Other types of display device are electroluminescent displays, such as organic light emitting devices (OLEDs) and polymer light emitting device (PLEDs).

It is desirable to be able to manufacture large area displays of relatively light weight for use in portable devices such as computers, electronic books, personal digital assistants, and the like. Certain organic, polymeric substrates are much lighter than glass while being transparent and are therefore preferred for use over glass in large area, lightweight displays. However, one problem with polymeric substrate displays is the difficulty of properly aligning such substrates, especially if both films are produced using roll-to-roll formation processes. In addition, polymeric substrates often require organic or inorganic coatings with high barrier properties, to prevent ingress of moisture, oxygen, and/or other contaminants into the substrates.

SUMMARY OF THE INVENTION

A display includes a front panel and a back panel with a light control material in between. One of the panels includes a rigid substrate, for example made of glass or rigid plastic. The other of the panels includes a flexible substrate, for example made of a flexible plastic film. A method of making the panel includes separately fabricating the panels, and then combining them together. The separate fabrication may include performing various roll-to-roll fabrication operations on the panel with the flexible substrate while the flexible substrate is still part of a web of material. The panels with the rigid substrate may be separately fabricated, then combined with the other panel on the web through a pick and place operation that accurately locates the panel relative to the one another. The combined panels may be then separated from the web to form the display. The display may be any of a variety of displays, such as liquid crystal displays (LCDs), and electroluminescent displays, such as polymer light emitting devices (PLEDs) and organic light emitting devices (OLEDs).

According to an aspect of the invention, a method of producing a display includes: forming a first panel having a rigid substrate; forming a second panel having a flexible substrate, wherein the forming includes roll forming the second panel on a web of the flexible substrate material; placing the first panel on the second panel; joining the first panel and the second panel; and separating the joined panels from the web.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings:

FIG. 14 is a schematic cross-sectional view of another alternate embodiment back panel in accordance with the present invention;

FIG. 14A is a schematic cross-sectional view of an electroluminescent device in accordance with the present invention;

FIG. 15 is a schematic cross-sectional view of an electroluminescent device back panel in accordance with the present invention;

FIG. 16 is a schematic cross-sectional view of an alternate embodiment electroluminescent device in accordance with the present invention;

FIG. 17 is a schematic cross-sectional view of another alternate embodiment electroluminescent device in accordance with the present invention;

DETAILED DESCRIPTION

Figure 1A:
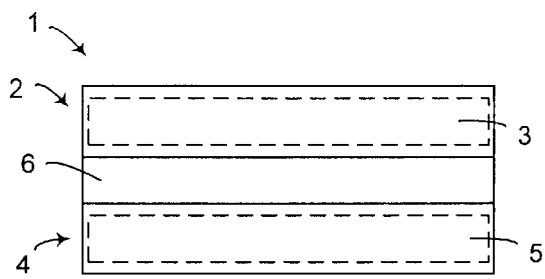
FIG. 1A is a schematic cross-sectional view of a display in accordance with the present invention.

Referring to FIG. 1A, a display device 1 includes a front panel 2 having a rigid front substrate 3, and a back panel 4 having a flexible back substrate 5. A light control material 6 is between the front panel 2 and the back panel 4. As used in this patent application, a "light control" material can perform one or more of the following functions: emission of light, and regulation of light from another source by transmission, reflection, and/or refraction. Exemplary types of display devices include LCD devices, for which the light control material is a liquid crystal material, and polymer light emitting devices (PLEDs) and organic light emitting devices (OLEDs), for which the light control material is a light emitting material. An exemplary material for the front substrate is glass, and an exemplary material for the back substrate is a polymer film. The device may be formed by forming the back panels in a series of roll-to-roll operations, and then placing discrete front panels on the back panels through a pick and place operation.

In the description given below, first the substrate of an LCD device is described briefly, in broad terms. Then a process for making the LCD device is described. Following this, the substrate of a PLED device is described in broad terms, and a process of making the PLED device is described with particular attention to operations in which that process differs from the process previously described for LCD devices. Variation on the process and the device are also described throughout.

LCD Devices

Figure 1:
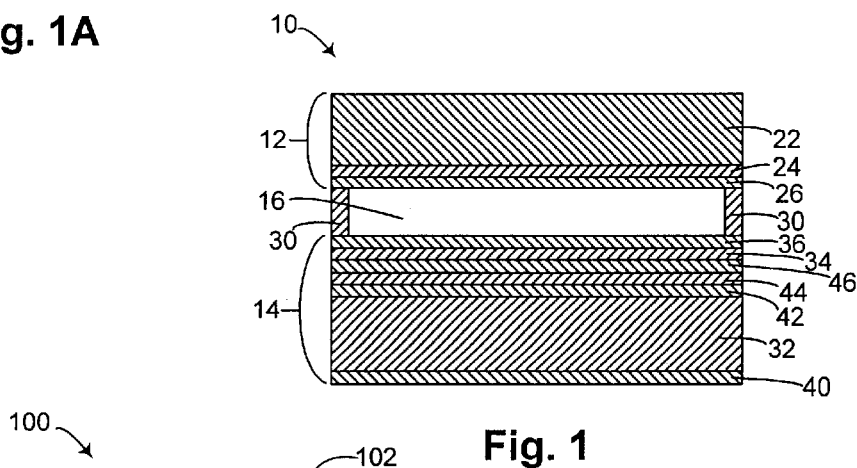
FIG. 1 is a schematic cross-sectional view of a liquid crystal display (LCD) device in accordance with the present invention.

Referring to FIG. 1, the general structure of a LCD device 10, an embodiment of the display device 1, is shown. The LCD device 10 includes a front panel 12 and a back panel 14, with a layer of liquid crystal material 16 between the panels 12 and 14. As described in greater detail below, many variations in the configuration the front panel 12 and the back panel 14 are possible.

The front panel 12 may include a front substrate 22, front electrodes 24, and a front alignment or orientation coating or layer 26. A seal ring 30 joins the front panel 12 and the back panel 14, and retains the liquid crystal material 16 between the front panel 12 and the back panel 14. The back panel 14 may include a back substrate 32, back electrodes 34, a back alignment or orientation coating or layer 36, an outer-side protective layer 40, a back barrier layer 42, an opaque layer 44, and an internal protective layer 46.

The front substrate 22 may be a rigid substrate. For example, the front substrate 22 may be a glass substrate. The glass may be a conventionally-available glass, for example having a thickness of approximately 0.2–1 mm. Alternatively, the front substrate 22 may be made of other suitable transparent materials, such as a rigid plastic or a plastic film. The plastic film may have a high glass transition temperature, for example above about 65 degrees C., and may have a transparency greater than 85% at 530 nm.

The back substrate 32 may be a flexible substrate, such as a polymeric film substrate. The back substrate 32 may be made of an optically-transparent thermoplastic polymeric material. Examples of suitable such materials are polycarbonate, polyvinyl chloride, polystyrene, polymethyl methacrylate, polyurethane polyimide, polyester, and cyclic polyolefin polymers. More broadly, the back substrate 32 may be a flexible plastic such as a material selected from the group consisting of polyether sulfone (PES), polyethylene terephthalate (PET), polyethylene naphthalate, polycarbonate, polybutylene terephthalate, polyphenylene sulfide (PPS), polypropylene, aramid, polyamide-imide (PAI), polyimide, aromatic polyimides, polyetherimide, acrylonitrile butadiene styrene, and polyvinyl chloride. Further details regarding substrates and substrate materials may be found in International Publication Nos. WO 00/46854, WO 00/49421, WO 00/49658, WO 00/55915, and WO 00/55916, the entire disclosures of which are herein incorporated by reference in their entireties.

The back substrate 32 may be a transparent polymer film with better than 85% transmission at 530 nm.

The electrodes 24 and 34 may include commonly-known transparent conducting oxides, such as indium tin oxide (ITO). It will be appreciated that other metal oxides may be employed, such as indium oxide, titanium oxide, cadmium oxide, gallium indium oxide, niobium pentoxide, and tin oxide. In addition to a primary oxide, the electrodes may include a secondary metal oxide such as an oxide of cerium, titanium, zirconium, hafnium, and/or tantalum. The possible transparent conductive oxides include $ZnO_2$, $Zn_2SnO_4$, $Cd_2SnO_4$, $Zn_2In_2O_5$, $MgIn_2O_4$, $Ga_2O_3$—$In_2O_3$, and $TaO_3$. The electrodes 24 and 34 may be arranged on the inside surface of the substrates 22 and 32 in either a segmented or X-Y matrix design, as is well known in the art, to form a plurality of picture elements (pixels). The electrodes 24 and 34 may be formed, for example, by low temperature sputtering or direct current sputtering techniques (DC-sputtering or RF-DC sputtering), followed by selective removal of material. Although only a few electrodes are shown, in practice a large number of electrodes are incorporated in the cell and the number will generally increase as the area dimensions of the cell increase. The electrodes 24 and 34 may have leads that are connected to bus leads, which in turn are connected to addressing electronics. The electrodes 24 and 34 may be addressed independently to create an electric field at selected pixels. In some addressing schemes, the electrodes are sequentially and repeatedly scanned at a rapid rate to provide moving images similar to television images. This requires "refreshing" the display at short time intervals to rapidly turn pixels on and off.

In an exemplary embodiment, the electrodes 24 and 34 may each have a width of 200 microns, with a 20 micron gap between electrodes, thus resulting in a display having pixels that are 200 microns by 200 microns in size, although it will be appreciated that other electrode sizes and gap sizes may be employed. The electrodes may have a sheet resistance of less than about 60 ohms.

The back electrodes 34 alternatively may be opaque electrodes, such as copper or aluminum electrodes. More broadly, the back electrodes may be elemental metal electrodes (opaque or transparent) that contain silver, aluminum, copper, nickel, gold, zinc, cadmium, magnesium, tin, indium, tantalum, titanium, zirconium, cerium, silicon, lead, palladium, or alloys thereof. Metal electrodes on plastic film have the advantage of higher conductivity than ITO electrodes on film.

The alignment coatings 26 and 36 cause a desired orientation of the liquid crystal material 16 at its interface with the panels 12 and 14. This ensures that the liquid crystal rotates light through angles that are complementary to the alignment of the polarizers that may be associated with the cell. The display 10 may include polarizing elements, depending on the type of display (the type of liquid crystal material utilized).

The alignment compositions may include a variety of well-known polymeric materials, for example a polyimide which can be spin coated or printed from solvent, and (if necessary) rubbed with cloth, such as velvet, to provide a useful alignment layer.

The barrier layer 42 prevents moisture and oxygen from being transported through the display. The barrier layer 42 functions to protect layers underneath from environmental damage caused by exposure to oxygen and/or water. In addition, the barrier layer 42 may also function as an adhesion promoter. As the LCD cell gap shrinks, the requirement in barrier performance increases because ingress of fewer water molecules will result in formation of undesirable black spots in the display. The moisture and oxygen barrier may be a conventional suitable material, such as $SiO_2$. Alternatively, the barrier may be $SiO_x$, where $1<x<2$. Using $SiO_x$ instead of $SiO_2$ may provide an additional moisture and oxygen barrier for the display 10, better preventing moisture and oxygen from being transported through the display. The value x for the $SiO_x$ may be controlled, for example, by controlling the oxide ratio in the material used in sputtering the oxide layer, by adding oxygen to an SiO material.

It will be appreciated that the materials for the front substrate 22 and/or the back substrate 32 may be selected to act on their own as a suitable moisture and oxygen barrier. Thus the need for a separate moisture and oxygen barrier may be avoided entirely. For example, a glass front substrate may be sufficiently impermeable to moisture and oxygen to function on its own as a barrier.

Generally speaking, it will be appreciated that the liquid crystal material 16 may include any of a wide variety of suitable liquid crystal materials, such as twisted nematic, cholesteric, and ferroelectric materials.

Twisted nematic liquid crystal devices have a helical or twisted molecular orientation, for example turned by 90 degrees. When an electric field is applied to the liquid crystal material by electrodes incorporated into the device, the molecules re-orient and "unwind" due to the electrical anisotropy of the molecules. This behavior allows the molecules to rotate polarized light when in the twisted state and thereby pass light without rotation when in the untwisted state. When used in combination with polarizers, this ability to rotate polarized light allows the display to act as a light valve, either blocking or passing transmitted or reflected light. When individually addressable electrodes, such as the electrodes 24 and 34, are incorporated into the display, the display device has the ability to display images.

The back panel 14 may be opaque. The opaqueness of the back panel 14 may accomplished in any of a variety of way. For example, the back substrate 32 may be made of an opaque material, such as a suitable opaque polymer material, for example one of the transparent polymer materials discussed above to which a dye or other pigmentation is added. Alternatively, and as illustrated in FIG. 1, the back substrate 32 may include the opaque material layer 44, which may be a polymer which is the same as or different from the transparent polymer of the remainder of the back substrate 32.

Alternatively or in addition, as noted above, the electrode material for the back electrodes 34 itself may be opaque. For example, the electrode material may be aluminum or copper, which is opaque when deposited on the polymer substrate material. The depositing of the electrode material may be by sputtering, for example.

It will be appreciated that a suitable opaqueness may alternatively be achieved by printing an opaque ink between all or a portion of the back substrate 32 and the back electrodes 34.

The opaque substrate and/or electrode material may be used for display devices where light is not transmitted therethrough, but is either reflected by the liquid crystal material or is absorbed by the opaque substrate and/or electrode material. An exemplary suitable liquid crystal material for such a display is a zero field multistable cholesteric liquid crystal mix, such as that described in U.S. Pat. No. 5,889,566, which is incorporated herein by reference. Displays including zero field multistable liquid crystal display (FMLCD) technology have many advantages, such as inherent stability in the display without the need to refresh the display, thus allowing a display that can maintain an image in a no-power mode; excellent sunlight readability; and fast switching operation, for example on the order of 30 milliseconds per frame; and the ability to display various gray scales.

It will be appreciated that alternatively the front panel may be opaque and the back panel transparent, with suitable modifications to the above-described structure.

The front substrate 22 may have an organic coating thereupon to facilitate adhesion of the sealant ring 30. The sealant ring 30 may be made of a conventional suitable sealant material that may be used for containing the liquid crystal material 16 between the front panel 12 and the back panel 14. It will be appreciated that the sealant ring 30 may alternatively be a part of the back panel 14, if desired. The liquid crystal material 16 may be placed between the panels 12 and 14 prior to the joining of the panels, for example by printing the liquid crystal material on either of the panels. Another method is a dispensing method, in which exact amount of liquid crystal is dispensed on to the substrate before joining two panels. Alternatively, and as in the method described below, the liquid crystal material 16 may be placed between the panels 12 and 14 after the joining of the panels 12 and 14, for example by filling the space between the panels through a gap in the sealant ring 30, the gap in the sealant ring subsequently being plugged or otherwise blocked.

In order to allow the preparation of large area displays with uniform spacing and resulting appearance the front panel 12 and/or the back panel 14 may include protrusions and/or other spacers to maintain desired spacing between the front substrate 22 and the back substrate 32.

The outer-side protective layer 40 serves to protect the back substrate 32 from damage and to give dimensional stability to the film. The protective layer 40 may be a copper or aluminum foil, for example. In embodiments for which the back substrate 32 is transparent and the opaque layer 44 is eliminated, a metal protective layer may also function as a reflective layer. The protective layer also serves as a moisture and oxygen barrier. The protective layer may be a metallic film or a film-foil laminate.

The internal protective layer 46 may be an acrylic hard coat layer. As described in further detail below, laser light such as excimer laser light may be used to pattern the back electrodes 34. The internal protective layer 46 may protect laser light penetrating and damaging functional layers (such as the opaque material layer 44 and the barrier layer 42) between the internal protective layer 46 and the back substrate 32. Acrylic, like other organic polymers, has a relatively low thermal conductivity, thereby minimizing lateral damage in ablation that may accompany the laser ablation to pattern the back electrodes 34. It will be appreciated that other suitable materials, such as other suitable polymers, may alternatively be included in the internal protective layer 46.

Process for Making LCD Devices

Figure 2:
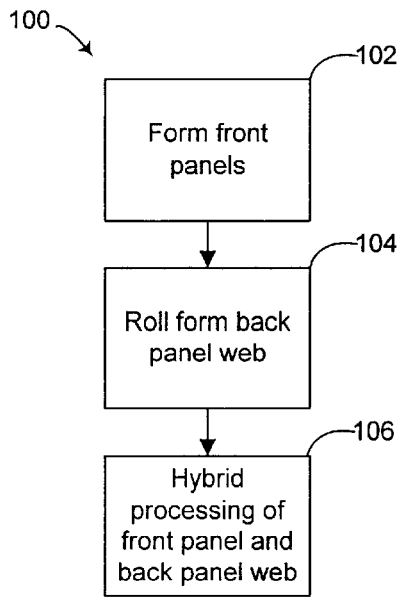
FIG. 2 is a high-level flow chart of a method in accordance with the present invention for making the LCD device of FIG. 1.

Turning now to FIG. 2, a high-level flow chart is shown, providing an overview of a method 100 for fabrication of displays such as the display 10. In step 102, the front panels 12 are formed. The front panels 12 may be formed by sheet handling processes involving a relatively large sheet of material upon which multiple front panels are formed. After formation of the front panel structures on the sheet, the individual front panels may be separated from the sheet.

In step 104 a back panel web is formed by roll-to-roll processing in which the part or all of the structures of the back panels 14 are formed on a web of material, for example on a web of polymer (plastic) film which forms the back substrates 32 of multiple back panels.

Thereafter, in step 106 hybrid processing is performed on the front panels 12 and the back panel web. As explained in greater detail below, further processing is performed on the back panel web to produce the structures of the back panels 14. Then the front panels 12 are placed in proper alignment with and are joined to respective of the back panels 14. The placement of the front panel 12 on the back panel 14 may be accomplished by a pick and place operation. Known suitable mechanical and/or vacuum pick and place devices may be utilized in the pick and place operation.

Figure 3:
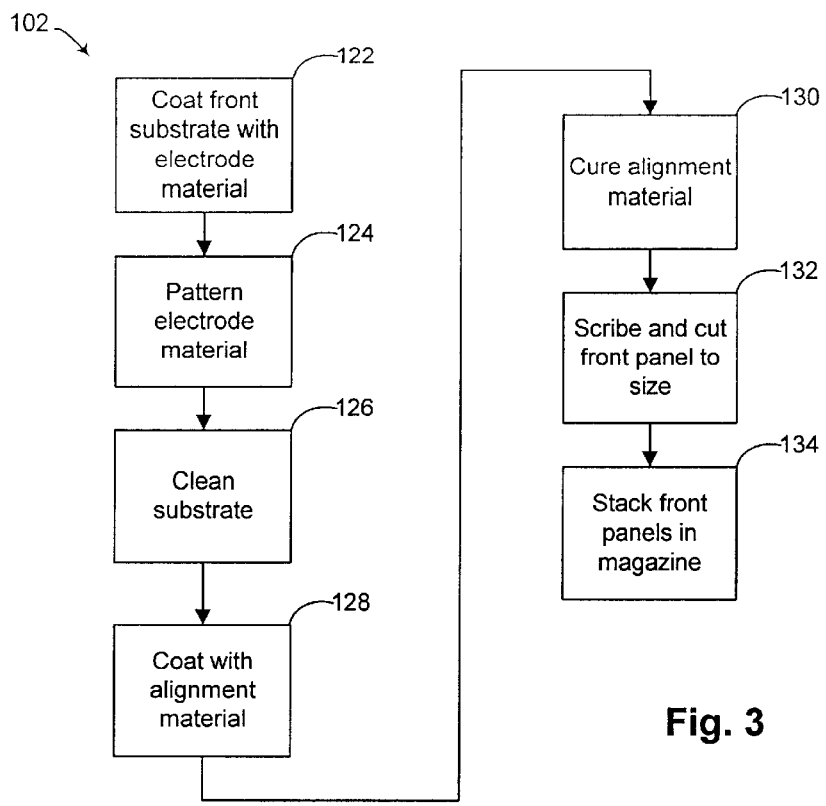
FIG. 3 is a flow chart of steps of making the front panel of the LCD device of FIG. 1.
Figure 4:
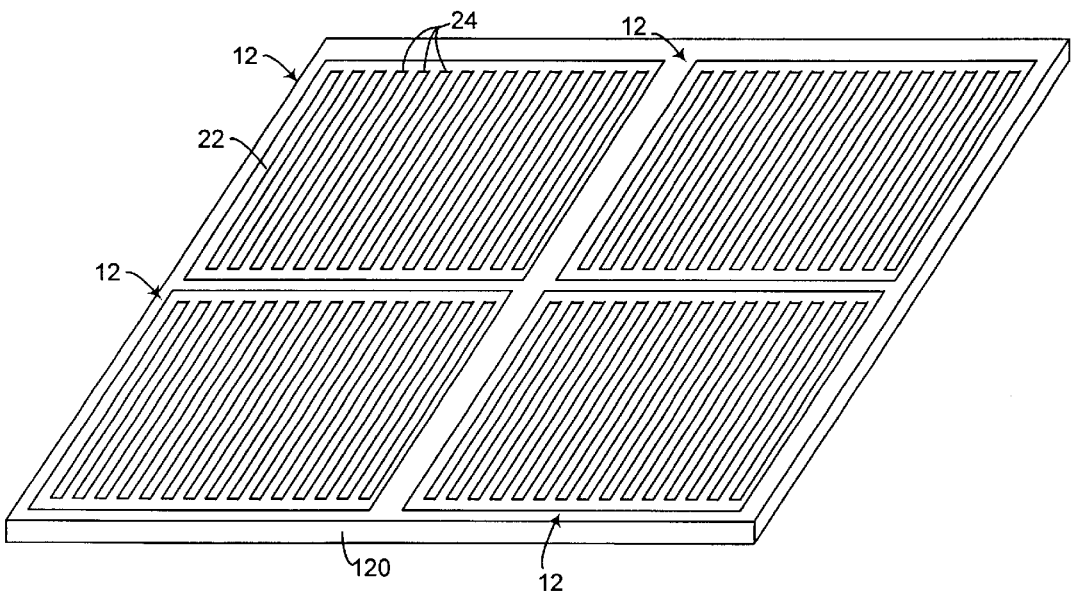
FIG. 4 is a perspective view illustrating the sheet processes of FIG. 3.

Referring now to FIGS. 3 and 4, the step 102 of fabricating the front panel 12 includes various sheet processing operations. In the sheet processing operations multiple front panels 12 are fabricated on a single sheet 120 of substrate material. In substep 122, the sheet 120 of substrate material is coated with electrode material, such as ITO. Then in substep 124 the electrode material is patterned, selectively removing some of the electrode material to produce the electrodes 24. The patterning may be accomplished any of a variety of known suitable etching processes, such as wet etching.

After the substrate is cleaned in substep 126, the layer of alignment material 26 is then coated onto the substrate in substep 128. In substep 130, the alignment material 26 is cured or allowed to dry. As noted above, the layer of alignment material 26 may be spin coated or printed, and may be rubbed to produce the desired alignment.

Thereafter, in substep 132, the individual front panels 12 are scribed and separated from each other and from the remainder of the sheet 120. In substep 134 the separate front panels 12 are stacked in a magazine, to be later joined with the web of back panels, such as in a pick and place operation.

It will be appreciated that the substeps 122–134 shown in FIG. 3 and described above are but one method of forming the front panels 12. The sheet processing operations may be performed in a different order, if suitable. In addition, some of the described above may be omitted, if desired, and other steps may be substituted or added. For example, the fabrication process may include printing or otherwise depositing the liquid crystal material on the front panel 12. As another example, the fabrication process may include depositing spacers upon the front panel 12 or forming spacers as part of the front panel 12. The spacers function to maintain a desired separation between the front substrate 22 of the front panel 12, and the back substrate 32 of the back panel 14. The spacers may take the form of plastic spheres which are not attached to either of the panels 12 and 14, and which may be sprayed onto the panels. Alternatively, the spacers may be protrusions such as posts, ribs, ridges, or other structures that are formed as part of the front panel 12, for example being attached to the alignment coating layer 26. It will be appreciated that a wide variety of spacers are known in the art, including structures which may be formed after joining of front and back panels, for example by selectively curing a resin material which is mixed with the liquid crystal material.

It will be further appreciated that some or all of substeps of the forming of the front panels 12 may be performed other than as sheet processing operations.

Figure 5:
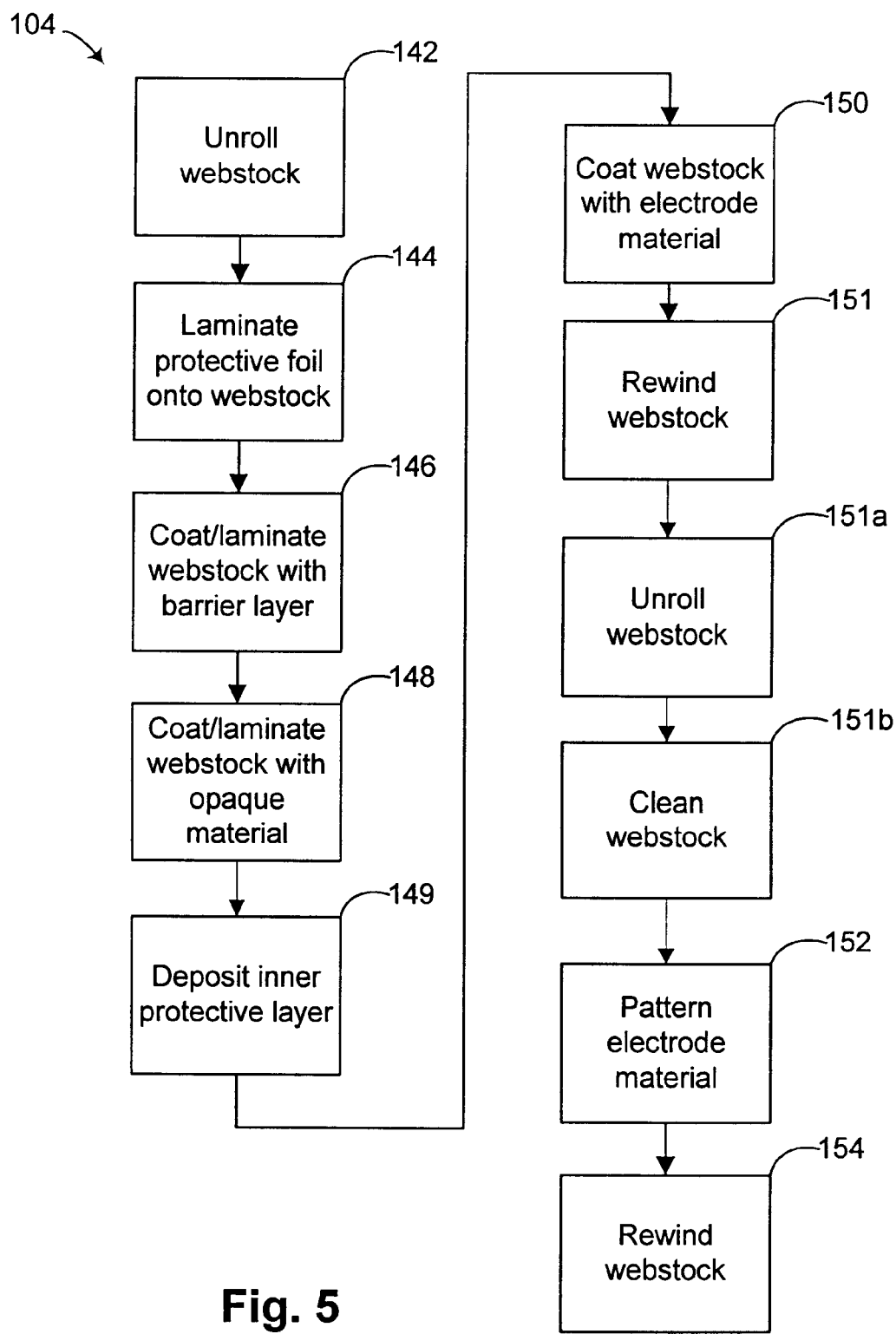
FIG. 5 is a flow chart of some of the steps of making the back panel of the LCD device of FIG. 1.

Turning now to FIG. 5, the step 104 of forming of the back panel web begins in substep 142 with unrolling webstock. The webstock acts as a substrate for the back panels 14, and may be a web of plastic film. In substep 144 the webstock is laminated with the protective layer 40, such as a copper foil, on its outer side (the side which will be away from the LCD material when the front panels 12 and the back panels 14 are assembled). The protective layer protects the resulting back panels 14 from damage.

In substep 146 the webstock is coated or laminated with the barrier layer 42 to prevent contaminants such as moisture and oxygen from reaching the liquid crystal material. Then the opaque material 44, such as a layer of black material, is laminated or coated on the webstock in substep 148. The opaque material is used for reflective cells, for example in FMLCD cells in which the liquid crystal material itself reflects light. It will be appreciated that the opaque material may be omitted where non-FMLCD cells are employed, for example in transmissive LCD cells and reflective LCD cells where a metal layer is used as a reflector. In substep 149 the inner protective layer 46 is coated, laminated, or otherwise deposited.

The back electrode material, such as indium tin oxide, is then coated onto the web stock in substep 150. As noted above, the electrode material may be a copper or aluminum that is deposited, such as by sputter coating, or is printed, onto the webstock. After coating, the webstock is rewound in substep 151, and is sent to a separate processing station for electrode patterning.

The further processing begins in substep 151*a* with unwinding of the webstock. Then in substep 151*b* the webstock is cleaned. In substep 152, the electrode material is patterned to form the electrodes. The patterning may include conventional processes, such as wet etching. Alternatively or in addition, the patterning may include ablation of the electrode material to remove the electrode material between electrodes. The ablation may include removal of the electrode material through use of an excimer laser. For example, an XeCl excimer laser with a wavelength of 308 nm or a KRF excimer laser with a wavelength of 248 nm may be used to ablate the electrode material. The laser may provide a range of energy per pulse of 50–1000 mJ/cm$^2$, spectrally narrowed laser wavelengths with the difference between longer and shorter wavelengths being about 0.003 nm or less, large beam dimensions (e.g., 7 mm by 7 mm (about 50 mm²)). Further details of excimer laser ablation may be found in U.S. application Ser. No. 09/783,105, filed Feb. 14, 2001, titled "Multilayered Electrode/Substrate Structures and Display Devices Incorporating the Same," and U.S. application Ser. No. 09/783,122, filed Feb. 14, 2001, titled "Multilayer Electrode/Substrate Structures and Liquid Crystal Devices Incorporating the Same," both of which are herein incorporated by reference in their entireties.

Finally, in substep 154 the webstock is rewound to await further processing in the hybrid processing step 106.

The substeps 142–154 may be performed in one or more roll-to-roll operations. The substeps 142–154 are merely one example of substeps employed in forming the back webstock, and it will appreciated that other steps may be added, and/or that some of the steps described above may be suitably altered and/or omitted, if desired.

Figure 6:
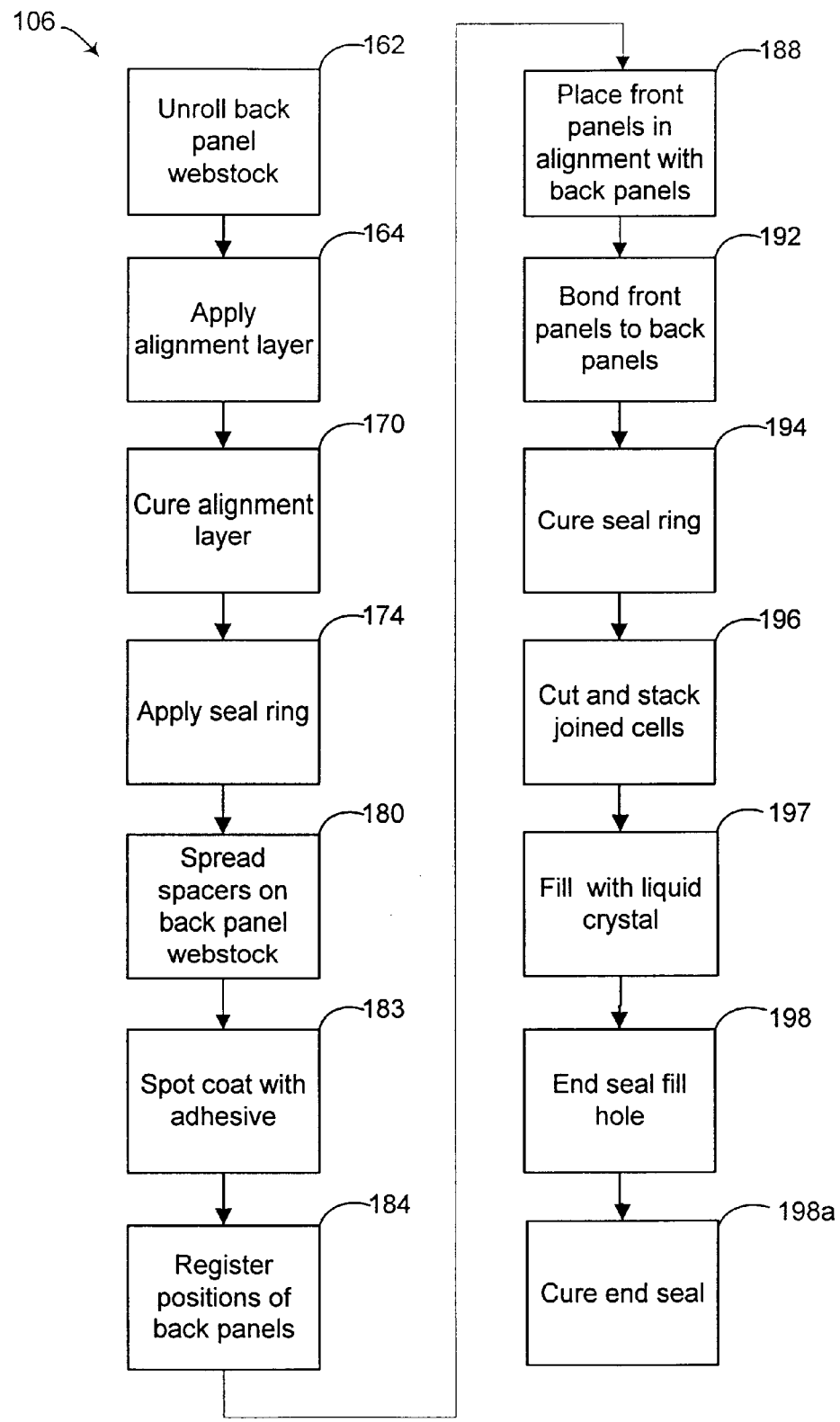
FIG. 6 is a flow chart of some of the steps of the hybrid processing of the front and back panels of the device of FIG. 1.
Figure 7:
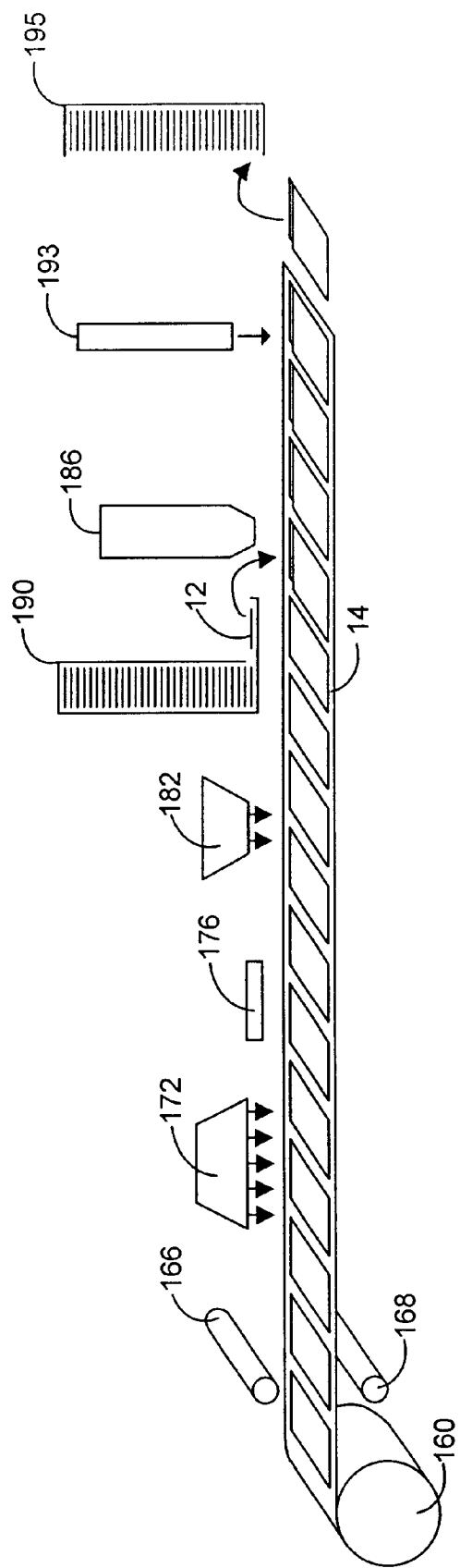
FIG. 7 is a schematic illustration of some of the steps of the hybrid processing of FIG. 6.

FIG. 6 shows a flow chart of substeps in the hybrid processing step 106. FIG. 7 schematically illustrates roll processing involving some of the substeps. In the roll processing of the hybrid processing step 106, a back webstock 160 may be indexed at some or all of the processing stations in the roll processing. In substep 162 a roll of the back webstock 160 is unwound. The back webstock 160 is webstock such as that produced in the step 104 described above with respect to FIG. 5.

In substep 164 the alignment layer 36 is applied to the webstock 160. The alignment layer 36 may be a polyimide alignment layer printed on the webstock 160 by use of a flexo press, which is schematically represented by press rollers 166 and 168 in FIG. 7. Alternatively, the alignment layer material 36 may be deposited by sputtering, or by other suitable methods, such as physical vapor deposition (PVD) or spin coating. The alignment layer 36 is cured in substep 170, for example by subjecting the webstock to heating from a heater 172. If desired, the alignment layer 36 may be rubbed or otherwise treated to impart a directional alignment to the layer.

Thereafter the seal ring 30 is applied in substep 174. The seal ring 30 may be applied by printing of the seal ring at appropriate locations on the webstock 160, by use of a printing device 176. In substep 180, spacers are spread on the webstock 160, such as by spraying the spacers on the webstock 160 using a sprayer 182. In substep 183 the alignment material 26 is spot-coated with adhesive material, such as a UV-curable adhesive material. The adhesive material may patterned to be located at the perimeter of the front panels 12 so that the panels may be later anchored to a web of back panels.

In substep 184 the position of the back panel 14 on the webstock 160 is registered, for example using a CCD camera 186 to detect a registration or alignment mark on or near the back panel 14. Then in substep 188 the front panel 12 is removed from a magazine 190 and placed on the back panel 14 in a pick and place operation. It will be appreciated that the magazine 190 may be the same magazine into which the front panels 12 were loaded in substep 134 of step 102, as described above. The front panels 12 may be advanced to the front of the magazine 190 by a spring, and may be lightly retained for pick off by springy or mechanically retracting retainer fingers.

The pick and place operation may be performed by a pick and place device, which may include mechanical and/or vacuum grips to grip the front panel 12 while moving it into the desired location in alignment with the back panel 14. It will be appreciated that a wide variety of suitable pick and place devices are well known. Examples of such devices are the devices disclosed in U.S. Pat. Nos. 6,145,901, and 5,564,888, both of which are incorporated herein by reference, as well as the prior art devices that are discussed in those patents. Alternatively, rotary placers may be utilized to place the front panel 12 upon the back panel 14. An example of such a device is disclosed in U.S. Pat. No. 5,153,983, the disclosure of which is incorporated herein by reference.

The registration of the back panel 14 may be coordinated with placement of the front panel 12 on the back panel 14. For example, the CCD camera 186 and the pick and place device may be operatively coupled so as to insure alignment of the front panel 12 relative to the back panel 14 during and/or after the placement of the front panel onto the back panel. It will be appreciated that use of the pick and place device allows greater accuracy in the placement of the front panel 12 relative to the back panel 14, when compared to joining of front and back panels roll-to-roll processes involving combining respective front and back panel rolls. Devices produced by combining front and back panels from respective rolls may be prone to errors in alignment, due to the variations in dimension which may occur during fabrication of the front and back panels, variations in dimensions due to heating, stretching, and other processes involved in roll-to-roll fabrication.

The alignment during and after placement of the front panel 12 on the back panel 14 may improve electrode registration between the front electrodes 24 of the front panel 12 and the back electrodes 34 of the back panel 14. The electrodes of the panels may be registered to within 5 microns, and may even be registered to within 1 micron.

It will be appreciated that the front panels 12 must be sufficiently rigid so as to maintain sufficient dimensional stability and stiffness throughout the pick and place and registration processes. If the front panels 12 are too limp, they may flutter during the pick and place operation, interfering with proper position of the front panel 12 relative to the back panel 14. As an example, a suitable Gurley stiffness of the front panels in the machine direction may be about 40 mg or greater. Further information regarding acceptable stiffness for pick and place operations may be found in U.S. Pat. No. 6,004,682, the specification of which is incorporated herein by reference.

Thereafter, in substep 192, the front panel 12 is bonded to the back panel 14. The bonding may be accomplished by using a UV light source 193 to spot cure the adhesive applied to the front panel 12 in substep 183 of step 106, described above. The spot coating provides a way of quickly anchoring the front panel 12 and the back panel 14 together, to maintain the desired relative alignment of the front panel 12 and the back panel 14 during further processing steps.

Thereafter, the sealant rings 30 of the combined front and back panels may be cured in substep 194, such as by heating or by exposure to suitable radiation. Then, the combined front and back panels are cut and stacked in substep 196, and are loaded into a magazine 195. The space between the front panel 12 and the back panel 14 is filled with liquid crystal material in substep 197. Then the gap in the sealant ring 30 may be filled in substep 198 and cured in substep 198a. Further steps, such as singulating the displays 10 and testing the displays, may then be performed.

The fabrications steps and substeps described above are merely one example of the fabrication of a display, and it will be appreciated that the above-described method may be suitably modified by adding, removing, or modifying steps or substeps. For example, the display material alternatively may be deposited by printing, such as by ink jet printing or printing using a letterpress.

Formation of Protrusions and Recesses on Panels

Figure 8:
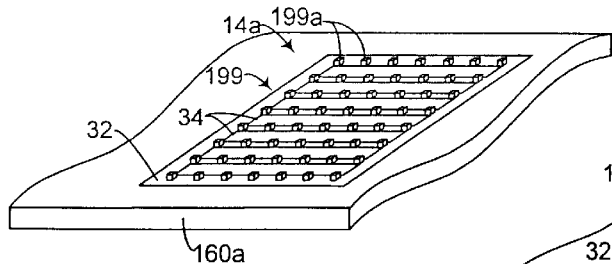
FIGS. 8 and 9 are perspective views illustrating roll processes for forming alternate back substrates according to the present invention.
Figure 9:
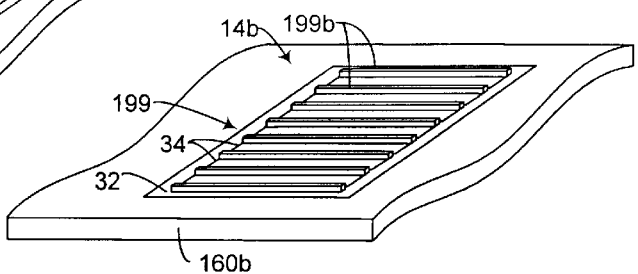

Turning now to FIGS. 8 and 9, back panels 14a and 14b, specific embodiments of the back panel 14, are shown upon respective back panel webstocks 160a and 160b. The back panels 14a and 14b include spacers for supporting the substrates in a spaced-apart relationship. As illustrated in FIGS. 8 and 9, the spacers may include protrusions 199 such as posts 199a and/or ribs 199b, in any of a variety of suitable shapes and/or configurations. For example, the spacers may have a tapered cross section, have a broader base and a narrower top part. Such a tapered shape may facilitate removal of electrode material from tops and sides of walls of the posts/ribs, which may help in avoiding short circuiting in the display 10.

The posts 199a may be located such that they do not contact either the back electrodes 34 or the front electrodes 24. The posts 199a and the ribs 199b may be used in conjunction with unattached spacers, such as the spherical plastic spacers described above.

The posts 199a and/or the ribs 199b may be formed prior to the coating with electrode material performed in substep 150 in the fabrication method described above. It will be appreciated that suitable modifications may be made in the above-described fabrication method to account for the presence of the posts 199a and/or the ribs 199b.

The posts 199a and/or the ribs 199b may be physically and chemically integral to the back substrate 32, and may be formed by a microreplication process. One technique of microreplicating arrays with very small surfaces requiring a high degree of accuracy is found in the use of continuous embossing to form cube corner sheeting. A detailed description of equipment and processes to provide optical quality sheeting are disclosed in U.S. Pat. Nos. 4,486,363 and 4,601,861. Tools and a method of making a tool used in those techniques are disclosed in U.S. Pat. Nos. 4,478,769; 4,460,449; and 5,156,863. The disclosures of all the above patents are incorporated herein by reference.

A machine 200 for producing a substrate such as that described above is shown in elevation in FIG. 10, suitably mounted on a floor 202. The machine 200 includes a frame 204, centrally located within which is an embossing means 205.

A supply reel 208 of unprocessed thermoplastic web 160a, 160b is mounted on the right-hand side of the frame 204; so is a supply reel 212 of flexible plastic film 215. An example of a suitable flexible plastic film 215 is a PET film available from DuPont, which is heat stabilized and has a glass transition temperature of 78 degrees C. and a use temperature of up to 120 degrees C. The flat web 160a, 160b and the film 215 are fed from the reels 208 and 212, respectively, to the embossing means 205, over guide rollers 220, in the direction of the arrows.

The embossing means 205 includes an embossing tool 222 in the form of an endless metal belt 230 which may be about 0.020 inches (0.051 cm) in thickness. The width and circumference of the belt 230 will depend in part upon the width or material to be embossed and the desired embossing speed and the thickness of the belt 230. The belt 230 is mounted on and carried by a heating roller 240 and a cooling roller 250 having parallel axes. The rollers 240 and 250 are driven by chains 245 and 255, respectively, to advance belt 230 at a predetermined linear speed in the direction of the arrow. The belt 230 is provided on its outer surface with a continuous female embossing pattern 260 that matches the general size and shape of the particular protrusions (posts 199a and/or ribs 199b) to be formed in the web 160a, 160b.

Evenly spaced sequentially around the belt, for about 180° around the heating roller 240, are at least three, and as shown five, of pressure rollers 270 of a resilient material, preferably silicone rubber, with a durometer hardness ranging from Shore A 20 to 90, but preferably, from Shore A 60 to 90.

While rollers 240 and 250 may be the same size, in the machine 200 as constructed, the diameter of heating roller 240 is about 10.5 inches (26.7 cm) and the diameter of cooling roller 250 is about 9 inches (22.9 cm). The diameter of each pressure roller 270 is about 6 inches (15.2 cm).

It may be desirable to maintain additional pressure about the tool and substrate during cooling, in which case the cooling roller 250 could be larger in diameter than the heating roller, and a plurality of additional pressure rollers, (not shown) also could be positioned about the cooling roller.

Either or both heating roller 240 or cooling roller 250, has axial inlet and outlet passages (not shown) joined by an internal spiral tube (not shown) for the circulation therethrough of hot oil (in the case of heating roller 240) or other material (in the case of cooling roller 250) supplied through appropriate lines (not shown).

The web 160a, 160b and the film 215, as stated, are fed to the embossing means 205, where they are superimposed to form a laminate 280 which is introduced between the belt 230 and the leading roller of the pressure rollers 270, with the web 160a, 160b between the film 215 and the belt 230. From thence, the laminate 280 is moved with the belt 230 to pass under the remaining pressure rollers 270 and around the heating roller 240 and from thence along belt 230 around a substantial portion of cooling roller 250. Thus, one face of web 160a, 160b directly confronts and engages embossing pattern 260 and one face of the film 215 directly confronts and engages pressure rollers 270.

The film 215 provides several functions during this operation. First, it serves to maintain the web 160a, 160b under pressure against the belt 230 while traveling around the heating and cooling rollers 240 and 250 and while traversing the distance between them, thus assuring conformity of the web 160a, 160b with the precision pattern 260 of the tool during the change in temperature gradient as the web (now embossed substrate) drops below the glass transition temperature of the material. Second, the film 215 maintains what will be the outer surface of substrate in a flat and highly finished surface for other processing, if desired. Finally, the film 215 acts as a carrier for the web 160a, 160b in its weak "molten" state and prevents the web from adhering to the pressure rollers 270 as the web is heated above the glass transition temperature.

The embossing means 205 finally includes a stripper roller 285, around which laminate 280 is passed to remove the same from the belt 230, shortly before the belt 230 itself leaves cooling roller 250 on its return path to the heating roller 240.

The laminate 280 is then fed from stripper roller 285 over further guiding rollers 220, eventually emerging from frame 204 at the lower left hand corner thereof. Laminate 280 is then wound onto a storage winder 290 mounted on the outside of frame 204 at the left hand end thereof and near the top thereof. On its way from the lower left hand corner of frame 204 to winder 290, additional guiding rollers guide the laminate 280.

The heating roller 240 is internally heated (as aforesaid) so that as belt 230 passes thereover through the heating station, the temperature of the embossing pattern 260 at that portion of the tool is raised sufficiently so that web 160a, 160b is heated to a temperature above its glass transition temperature, but not sufficiently high as to exceed the glass transition temperature of the film 215.

The cooling roller 250 is internally "fueled" (as aforesaid) so that as belt 230 passes thereover through the cooling station, the temperature of the portion of the tool embossing pattern 260 is lowered sufficiently so that web 160a, 160b is cooled to a temperature below its glass transition temperature, and thus becomes completely solid prior to the time laminate 280 is stripped from tool 230.

It has been found that the laminate 280 can be processed through the embossing means 205 at the rate of about 3 to 4 feet per minute, with satisfactory results in terms of the accuracy and dimensional stability and other pertinent properties of the finished substrate.

It will further understood that temperatures of the heating roller and cooling rollers may need to be adjusted within certain ranges depending upon the web material selected. Certain materials have higher glass transition temperature $T_G$ than others. Others may require cooling at a higher temperature then normal and for a longer time period. Preheating or additional heating at the entrance of the nips may be accomplished by a laser, by flameless burner, or by another device, and/or by adjusting the temperature of the heating roller to run at higher preselected temperature. Similar adjustments may be made at the cooling level.

A preferred material for the embossing tool disclosed herein is nickel. The very thin tool (about 0.010 inches (0.025 cm) to about 0.030 inches (0.076 cm)) permits the rapid heating and cooling of the tool 230, and the web 160a, 160b, through the required temperatures gradients while the pressure rolls and the carrier film apply pressure. The result is the continuous production of a precision pattern where flatness and angular accuracy are important while permitting formation of sharp corners with minimal distortion of other surfaces, whereby the finished substrate provides an array of protrusions (such as posts 199a and/or ribs 199b) formed with high accuracy.

The embossing means described herein, with suitable modifications of the tooling, substrate materials and process conditions, may be used to produce any one of the various substrate configurations disclosed herein. For example, in addition to the LCD spacer protrusions of 199a and 199b, the embossing means may be used to produce additional formations, including the recesses of the substrate of FIG. 12 and the ridges and wells of the substrate film for PLEDs of FIG. 16.

An alternative method of forming the protrusions 199a and/or 199b of FIGS. 8 and 9 is by printing UV-curable resins on a substrate, and then curing the resins to form the protrusions. An example of a suitable material is a black matrix material commonly used in making color filters, such as the OPTIMER CR Series Pigment Dispersed Color Resist available from JSR Corporation of Japan. Another example of UV-curable resins is UV-curable epoxy acrylates. The printing may be accomplished by ink jet printing or screen printing, for example. Further information regarding ink jet printing and screen printing may be found in U.S. Pat. Nos. 5,889,084, and 5,891,520, the disclosures of which are incorporated herein by reference. Other methods of forming microstructures with UV-curable resins may be found in International Publication No. WO 99/08151.

A further method of forming a substrate element includes forming protrusions on a major surface of a substrate by a photolithography process. The photoresist for the photolithography process may be a black matrix material of the type commonly used for producing color filters. A preferred material of this type is CSP series photo-sensitive rib materials by Fuji Film Olin Co., Ltd (Japan).

Figure 10A:
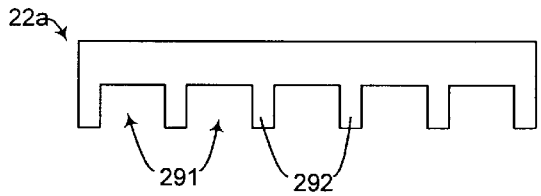
FIG. 10A is a schematic cross-sectional view of an alternate front substrate.

It will be appreciated that a structure or arrangement of protrusions and recesses may also be formed on a rigid substrate, an example being the front substrate 22a shown in FIG. 10A. The front substrate 22a has recesses 291 surrounded or bordered by protrusions 292. The arrangement of the recesses 291 and protrusions 292 on the rigid front substrate 22a may include any of a variety of suitable geometries of recesses and protrusions.

Figure 10:
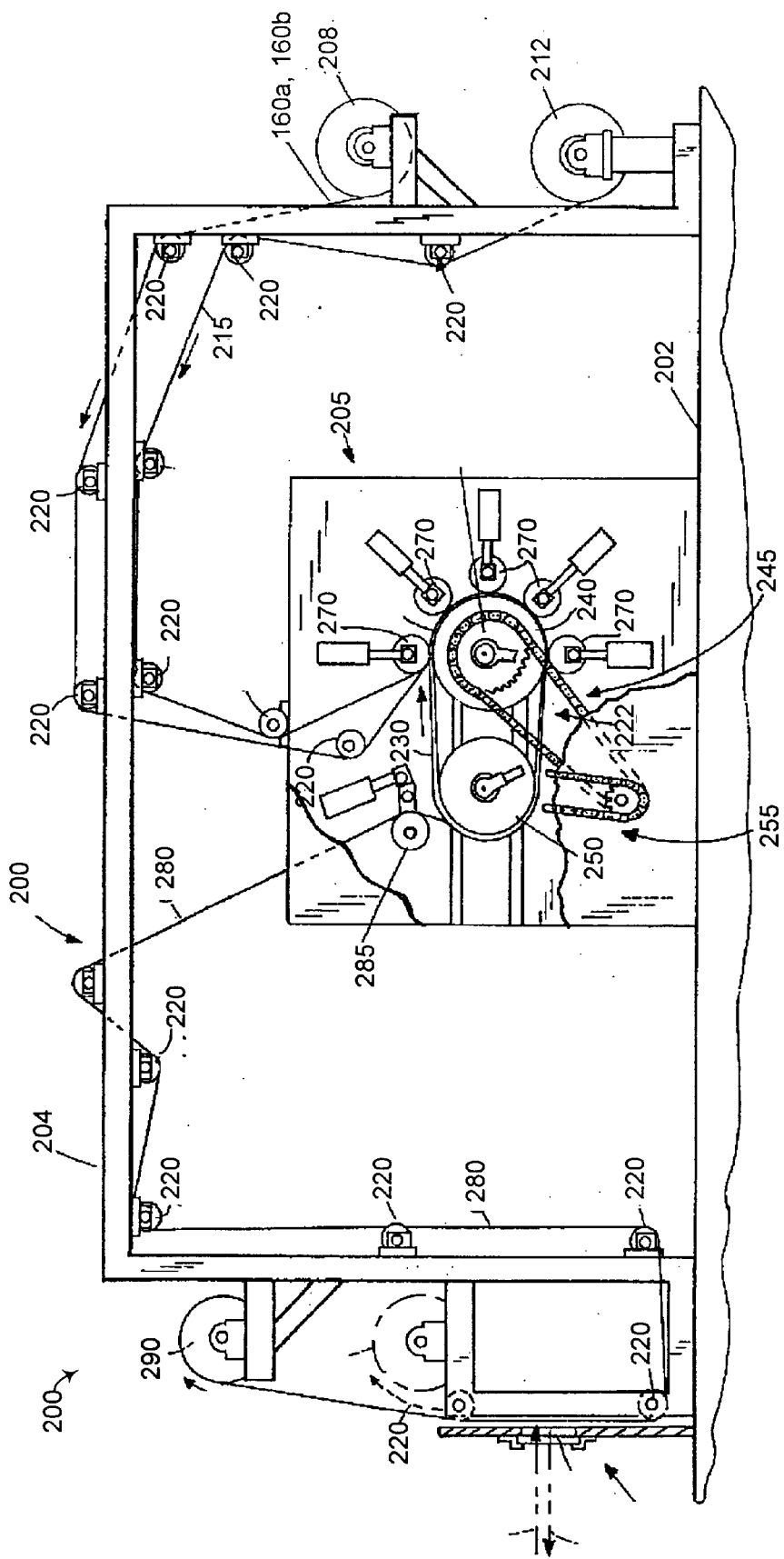
FIG. 10 is an illustration of a machine used in roll processes, for producing protrusions in accordance with the present invention.
Figure 10B:
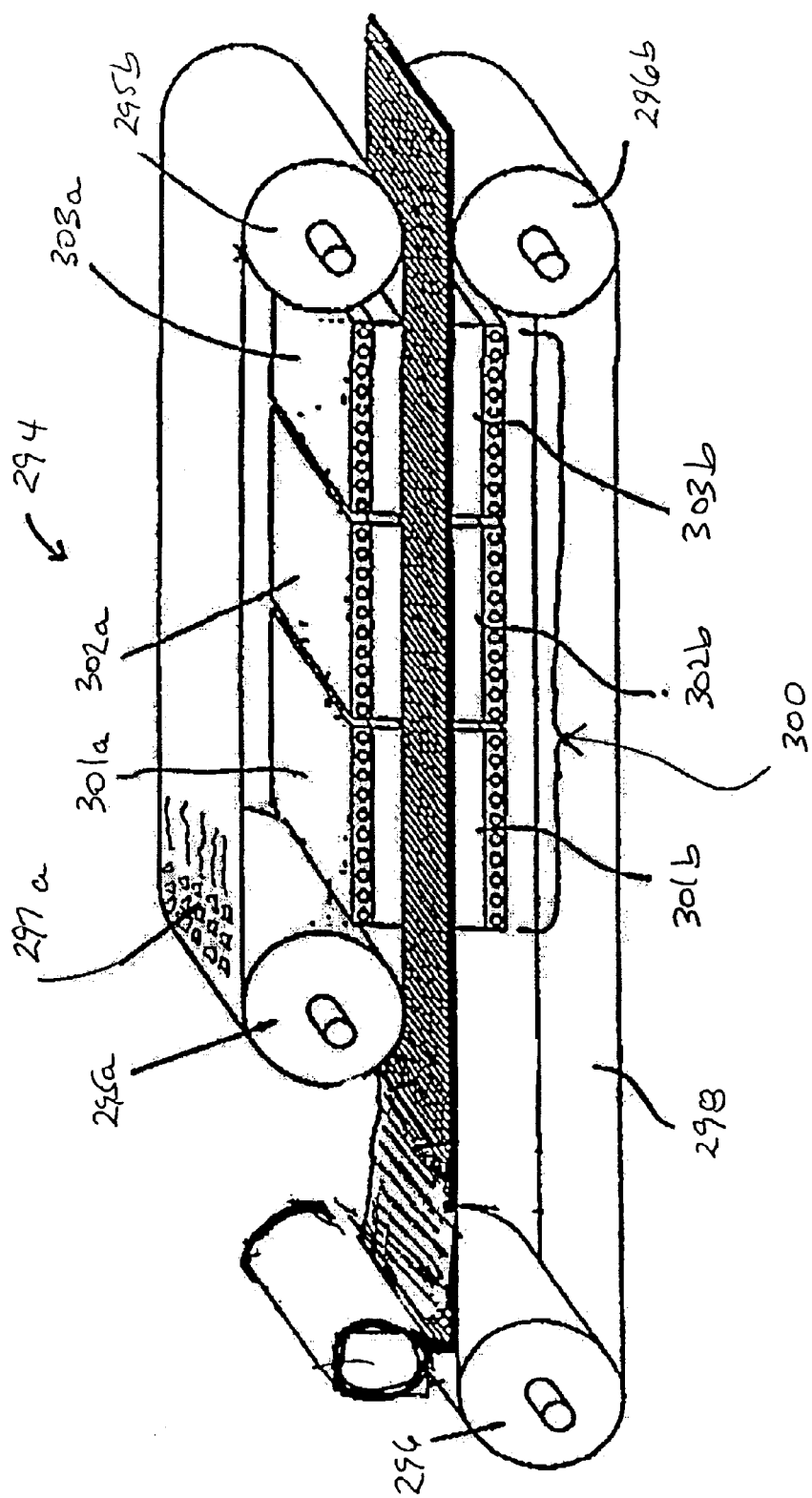
FIG. 10B is an illustration of an embossing machine used in producing the front substrate of FIG. 10A.

The arrangement of the recesses 291 and the protrusions 292 may be formed by any of a variety of suitable methods. For example, the above-described methods involving printing and curing UV-curable resins, and photolithography, may be utilized. As another alternative, a suitable embossing process may be used to form the arrangement of recesses and protrusions. A press 294 for carrying out an embossing process on rigid substrates is shown in FIG. 10B, and its operation is described briefly below. Further details regarding embossing of rigid materials may be found in commonly-assigned, co-pending U.S. patent application Ser. No. 09/596,240, entitled "A Process for Precise Embossing", filed Jun. 6, 2000, and in International Application PCT/US01/18655, filed Jun. 8, 2001. Both of these applications are incorporated herein by reference in their entireties.

Continuous presses, of which the press 294 of FIG. 10B is an example, include double band presses which have continuous flat beds with two endless bands or belts, usually steel, running above and below the product and around pairs of upper and lower drums or rollers. These form a pressure or reaction zone between the two belts and advantageously apply pressure to a product when it is flat rather than when it is in a curved form. The double band press also allows pressure and temperature to vary over a wide range. Dwell time or time under pressure is easily controlled by varying the production speed or rate, and capacity may be changed by varying the speed, length, and/or width of the press.

In use, the product is "grabbed" by the two belts and drawn into the press at a constant speed. At the same time, the product, when in a relatively long flat plane, is exposed to pressure in a direction normal to the product. Of course, friction is substantial on the product, but this may be overcome by one of three systems. One system is the gliding press, where pressure-heating plates are covered with low-friction material such as polytetrafluoroethylene and lubricating oil. Another is the roller bed press, where rollers are placed between the stationary and moving parts of the press. The rollers are either mounted in a fixed position on the pressure plates or incorporated in chains or roller "carpets" moving inside the belts in the same direction but at half speed. The roller press is sometimes associated with the term "isochoric." This is because the press provides pressure by maintaining a constant distance between the two belts where the product is located. Typical isochoric presses operate to more than 700 psi.

A third system is the fluid or air cushion press, which uses a fluid cushion of oil or air to reduce friction. The fluid cushion press is sometimes associated with the term "isobaric" and these presses operate to about 1000 psi. Pressure on the product is maintained directly by the oil or the air. Air advantageously provides a uniform pressure distribution over the entire width and length of the press.

In double band presses, heat is transferred to thin products from the heated rollers or drums via the steel belts. With thicker products, heat is transferred from heated pressure plates to the belts and then to the product. In gliding presses, heat is also transferred by heating the gliding oil itself. In roller bed presses, the rollers come into direct contact with the pressure-heating plates and the steel belts. In air cushion presses, heat flows from the drums to the belts to the product, and, by creating turbulence in the air cushion itself, heat transfer is accomplished relatively efficiently. Also, heat transfer increases with rising pressure.

Another advantage of the double band press is that the product may be heated first and then cooled, with both events occurring while the product is maintained under pressure. Heating and cooling plates may be separately located one after the other in line. The belts are cooled in the second part of the press and these cooled belts transfer heat energy from the product to the cooling system fairly efficiently.

Continuous press machines fitting the general description provided hereinabove are sold by Hymmen GmbH of Bielefeld, Germany (U.S. office: Hymmen International, Inc. of Duluth, Ga.) as models ISR and HPL. These are double belt presses and also appear under such trademarks as ISOPRESS and ISOROLL. To applicants' knowledge, such presses heretofore have not generally been used to emboss precise recesses, especially with polymeric materials.

Using the press in forming an arrangement of protrusions and recesses on a rigid substrate, such as a thermoplastic substrate, involves the following steps: providing a continuous press with an upper set of rollers, a lower set of rollers, an upper belt disposed about the upper set of rollers, a lower belt disposed about the lower set of rollers, a heating station, a cooling station, and pressure producing elements; passing an amorphous thermoplastic material through the press; heating the material to about 490° F. (255° C.); applying pressure of at least about 250 psi (17 bars) to the material; cooling the material to near its $T_g$ and, if desired, maintaining pressure on the material while the material is cooled.

Making reference to FIG. 10B, details of the press 294 are now described. The press 294 includes a pair of upper rollers 295a, 295b and a pair of lower rollers 296a, 296b. The upper roller 295a and the lower roller 296a may be oil heated. Typically the rollers are about 31.5 inches in diameter and extend for about 27.5 inches (70 cm). Around each pair of rollers is a steel (or nickel) belt 297, 298. An upper patterned belt 297 is mounted around the upper rollers 295a, 295b and a lower plain belt 298 is mounted around the lower rollers 296a, 296b. Only a portion of the pattern is illustrated, but it is understood that it will contain an array of male elements designed to provide the necessary size and shape of the receptor recesses 291. These belts may be generally similar to those continuous belts described above in conjunction with the continuous roll embossing process, for machine 200 (FIG. 10).

Heat and pressure are applied in a portion of the press referred to as the reaction zone 300. Within the reaction zone are means for applying pressure and heat, such as three upper matched pressure sections 301a, 302a, 303a and three lower matched pressure sections 301b, 302b, 303b. Each section is about 39 inches (100 cm) long and the width depends on the width of roll desired, one example being 27.5 inches (70 cm). Heat and pressure may be applied in other ways that are well known by those skilled in the art. Also, it is understood that the dimensions set forth are for existing or experimental continuous presses, such as those manufactured by Hymmen; these dimensions may be changed if desired.

The lower belt 298 will be smooth if only one side of a product is to be embossed. It is to be understood that the pressure sections may be heated or cooled. Thus, for example, the first two upstream pressure sections, upper sections 301a, 302a and the first two lower sections 301b, 302b may be heated whereas the last sections 303a and 303b may be cooled or maintained at a relatively constant but lower temperature than the heated sections.

Thermoplastic materials such as polysulfone, polyarylate, high $T_g$ polycarbonate, polyetherimide, and copolymers may be used in the press 294 (or the embossing machine 200). With such material, the pressure range is approximately 180 to 1430 psi and the temperature range is approximately 485° F. to 580° F. (250° C. to 340° C.). Material thicknesses of 75 µm to 250 µm may be embossed to provide the desired receptor recesses.

With the dimensions and reaction zones stated above, the process rate may move at about 21 to 32 feet per minute.

As discussed above, the embossing machine 200 shown in FIG. 10 would generally be suitable for use with relatively flexible materials, while the press 294 shown in FIG. 10B would generally be suitable for use with relatively rigid materials. The choice as to which type of microreplicating machine to employ may depend on the thickness and elasticity modulus of the material to be microreplicated. For example, polycarbonate has a modulus of elasticity of $10^8$ Pascals, as determined according to ASTM D882. Films of polycarbonate less than about 15 mils thick would preferably be run through a belt embosser, while films of polycarbonate greater than about 30 mils thick would preferably be run through a flat bed embosser. For materials with very low elasticity modulus, such as a rubbery foam, the upper limit of thickness for a belt embosser would be higher.

Alternative Back Panels

Figure 11:
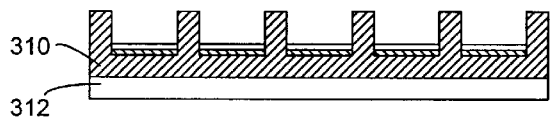
FIG. 11 is a schematic cross-sectional view of an alternate embodiment back panel for use with the LCD device of FIG. 1.

FIGS. 11–14 illustrate further alternate embodiments of the back panel 14. Turning initially to FIG. 11, a back panel 14' includes an opaque material layer 310 on and/or joined to a transparent material 312. The opaque material layer 310 and the transparent material 312 may be a part of the back substrate. Alternatively, the opaque material layer may be a coating or other material layer which is on the transparent material, but which is not a part of the back substrate.

The opaque material layer 310 may be a polymer material with a pigment or dye added, as described above. It will be appreciated that the opaque material layer 310 may be placed on top of the transparent material 312, forming part of the protrusions 302. Alternatively, the opaque material layer 310 may be underneath or within the transparent material. The opaque material may be of the same polymer type as the transparent material, or may be a different type of polymer. The opaque material layer may be joined to the transparent material by a variety of suitable, well-known methods. For instance, the opaque material layer 310 may be bonded with the transparent material 312 in a roll operation using the machine 200 shown in FIG. 10.

Alternatively, the opaque material layer 310 may be a metallic layer deposited on the transparent material 312 by sputtering or another suitable deposition method. As another alternative, the opaque material layer 310 may be an opaque ink layer.

Figure 12:
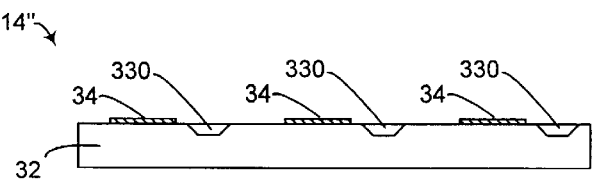
FIG. 12 is a schematic cross-sectional view of another alternate embodiment back panel for use with the LCD device of FIG. 1.

Referring to FIG. 12, a back panel 14", another alternate embodiment of the back panel 14, has driving electronics microstructure elements 330 embedded in the back substrate 32. The microstructure elements 330 are small electronic elements which may contain rudimentary driving logic, and which may be placed in corresponding recesses in the substrate 32 by such processes as fluidic self assembly. Further details regarding microstructure elements may be found in the above-mentioned International Publication Nos. WO 00/46854, WO 00/49421, WO 00/49658, WO 00/55915, and WO 00/55916, as well as in U.S. Provisional Application No. 60/252,247, the entire disclosure of which is herein incorporated by reference.

The back electrodes 34 of the back panel 14" are metal electrodes, such as copper or aluminum electrodes. Use of metal electrodes may allow for easier connection between the electrodes 34 and the microstructure elements 330, when compared to conventional connections between ITO electrodes and microstructure elements. Specifically, electrochemical problems of interconnections between ITO electrodes and Al conductors of the microstructure elements may be avoided.

Figure 13:
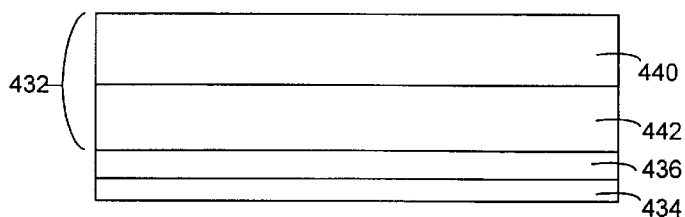
FIG. 13 is a schematic cross-sectional view of an alternate embodiment back panel in accordance with the present invention.

Turning now to FIG. 13, a back panel 414 includes a substrate 432 and back electrodes 434, with a solvent-resistant or primer layer 436 therebetween. The substrate 432 includes a metal foil layer 440 laminated on a substrate film 442.

The metal foil layer 440 may include an aluminum foil, a copper foil, or a stainless steel foil. The metal foil may be from 25 to 75 microns thick. The metal foil 440 functions both as a reflective layer and a barrier layer.

The substrate film 442 may include a polycarbonate film, a PET film, or a PES film. The substrate film 442 may have a thickness from 50 to 200 microns. The polycarbonate film may have a glass transition temperature from 120 to 220 degrees C. Suitable polycarbonate films include HA 120 and HT 200 films available from Teijin Limited, of Osaka, Japan. A suitable PET film is a PET film available from DuPont, which is heat stabilized and has a glass transition temperature of 78 degrees C. and a use temperature of up to 120 degrees C. It will be appreciated that other substrate film materials may be employed, such as those discussed above.

The solvent-resistant or primer layer may include an acrylic coating with a thickness of about 1 to 5 microns. The solvent-resistant material protects the underlying material from solvents used in later fabrication/processing operations, such as in depositing/coating an alignment material, or in wet etching to pattern the electrodes 434.

The back electrodes 434 may include ITO, a metal such as silver or aluminum, or a metal alloy such as a silver alloy. The ITO may have a surface resistance from 30 to 60 ohm/square. The silver or silver alloy may have a surface resistance from 5 to 30 ohm/square. The aluminum electrodes may have a surface resistance from 1 to 30 ohm/square.

FIG. 14 shows a back panel 514 that includes a back substrate 532 and back electrodes 534, with a primer layer 536 between the back substrate and the back electrodes.

The back substrate 532 includes a substrate film layer 542, coated on its back side with a barrier layer 544 and a protective opaque layer 546. Alternatively, the barrier layer 544 may be on the inside of the substrate film layer 542. The back substrate 532 may be a laminate. The substrate film layer 542 may be similar to the substrate film layer 442 shown in FIG. 13 and discussed above. The barrier layer 544 and the opaque layer 546 may include materials discussed above with regard to other embodiments. In addition, alternatively the barrier layer 544 may be a multilayer coating, such as a coating of alternating polymer and $SiO_x$ layers.

The primer layer 536 may include an acrylic coating 2 to 5 microns thick.

The electrodes 534 may be similar to the electrodes 434 shown in FIG. 13 and discussed above.

It will be appreciated that the back panels 414 and 514 may be modified to include microreplicated spacers (such as shown in FIGS. 8, 9, and 11, and described above), microreplicated receptor holes for microstructure elements (such as shown in FIG. 12), and/or via holes in the back substrates 424 and/or 524 to allow interconnection of driver electronics for selectively actuating (providing power to) individual of the back electrodes 434 and 534.

The back panels 414 and 514 may be utilized with suitable front panels. Front panels for utilization with the back panels 414 and 514 may include glass panels, for example 0.2 to 1 mm thick, with patterned electrodes, for example ITO electrodes having a surface resistance from 1 to 60 ohm/square. Alternatively, front panels for utilization with the back panels 414 and 514 may include rigid plastic panels with light transmission greater than 85% in the visible range, for example 0.2 to 2.5 mm thick polycarbonate or polymethylacrylate, with patterned electrodes, such as ITO electrodes having a surface resistance from 1 to 60 ohm/square. The resulting combination of the back panels 414 or 514 with suitable front panels may be utilized in liquid crystal displays.

Electroluminescent Displays

Referring now to FIG. 14A, an electroluminescent display device 601 is shown. The electroluminescent display device 601 is a specific embodiment of the display device shown in FIG. 1. The electroluminescent display device 601 includes a front substrate 602 and a back substrate 604, with a light emitting structure 606 therebetween. The light emitting structure 606 may include multiple layers, such as an anode, a hole transport layer, an emissive layer, and a cathode. The light emitting structure may also include other layers, such as a hole injection layer and/or an electron transport layer. Some of these layers may be suitably combined. For example, emissive material may be embedded in the electron transport layer. The layers between the anode and the cathode are generally referred to herein as "light emitting material."

FIGS. 15–19 show various embodiments of the electroluminescent display device 601 and/or parts thereof. Referring initially to FIG. 15, a back panel 614 for an electroluminescent display device includes an emitter and other (indicated generally as 616 and also referred to as a light emitting material) that can be made to electroluminesce by applying a voltage across the material by means of electrodes 624 and 634. As noted above, the layers 616 may include a hole transport material and the emitter. The back panel 614 may be part of an organic light emitting device (OLED) or alternatively may be a part of a polymer light emitting device (PLED). When a sufficiently large voltage is applied across the layers 616 by the electrodes 624 and 634, electrons are ejected from one of the electrodes (the cathode) and holes are emitted from the other of the electrodes (the anode). The electron-hole combinations are unstable, and combine in the emitter to release energy in the form of light.

The layers 616 may include any of a variety of suitable materials, such as semiconductor materials; organic compounds such as conjugated organics or conjugated polymers that have many of the characteristics of semiconductors; and suitable polymers such as poly-paraphenylene vinylene (PPV). For an OLED, the hole transport material may have a thickness from 100 to 500 Angstroms, and the emitter may have a thickness from 50 to 100 Angstroms. Further detail on suitable materials may be found in U.S. Pat. No. 5,703,436 and in U.S. Pat. No. 5,965,280, both of which are incorporated by reference in their entireties.

The electrodes 624 and 634 may be arrayed such that various parts of the light emitting material may be selectively actuated to luminesce. Further details regarding a suitable arrangement of electrodes may be found in the above-referenced U.S. Pat. No. 5,703,436.

The back panel 614 may include a flexible substrate 632 similar to the substrate 32 described above. The back panel 614 may also include an acrylic or other hard layer to facilitate laser ablation of the back electrodes 634. The back panel 614 may include a barrier coating, such as a multilayer barrier coating, to prevent contaminants, such as water and/or moisture, from entering.

Turning now to FIG. 16, an electroluminescent display device 710 (a passive matrix polymer light emitting device (PLED)) includes a microreplicated substrate film 712. The substrate film 712 has ridges or protrusions 714, and wells 716 between the ridges or protrusions 714. Each of the wells 716 is surrounded with four walls of the ridges 714, thereby forming a separate pixel. In each of the wells 716 are an anode 720, a hole transport layer 722, a light emitting polymer (LEP) 724, and a cathode 728. A rigid back panel 730 protects the back side of the display 710. The substrate film 712 and the back panel 730 are sealed by a sealant such as an epoxy resin (not shown in FIG. 16) to prevent moisture penetration into the display device 710.

It will be appreciated that suitable alternatives may be used for some of the above steps. For example, wet etching may be used instead of one or both of the laser etchings. As another example, sputtering deposition may be used instead of one or both of the inkjet printing processes.

The substrate film 712 may be polycarbonate, PET, or PES. The anode 720 is a transparent electrode, such as an ITO electrode or an electrode composed of silver or silver alloy. Formation of such transparent electrodes is described further in U.S. Pat. No. 5,667,853, which is incorporated herein by reference in its entirety. The hole transport layer 722 may include PEDOT/PSS material (polyethylene dioxy thiophene/polystyrene sulphonate), and may have a thickness from 20 to 60 nm. The LEP 724 may include poly (phenylene vinylene) derivatives, and may have a thickness of less than 200 nm. The cathode 728 may be a low work function electrode material, for example including Ca or Mg.

The back panel 730 may include glass, and may have an opaque coating such as a black coating or a metal coating to improve the contrast ratio of the display device 710. Alternatively, the back panel 730 may be uncoated, non-transparent (such as opaque) glass. As another alternative, the back panel 730 may be a polymer-metal laminate, such as the material for the back substrate 432 shown in FIG. 13 and described above. It will be appreciated that the polymer-metal laminate back panel may be part of a roll of such material.

Figure 20:
FIGS. 20 and 21 are cross-sectional views along directions 20—20 and 21—21, respectively, of FIG. 19.
Figure 21:
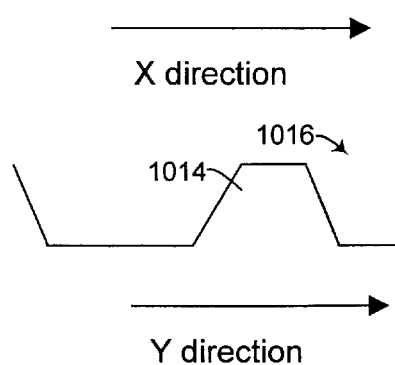
Figure 22:
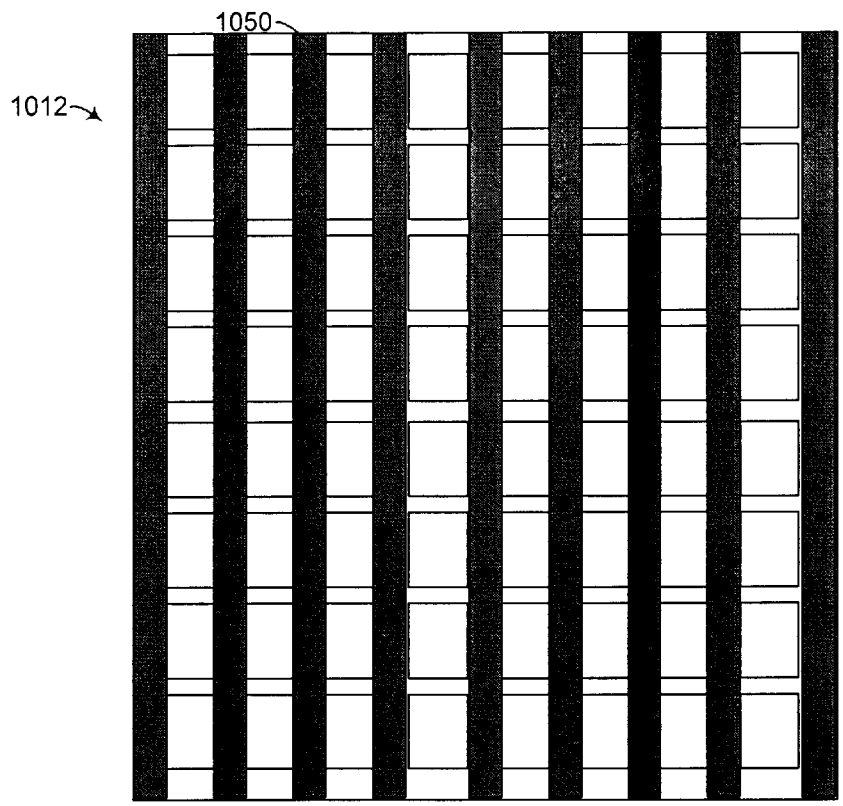
FIG. 22 is a plan view illustrating selective etching of an electrode layer on the substrate film of FIG. 19.

The ridges or protrusions 714 may have straight sides (as shown in FIG. 16), or alternatively may have tapered sides (as shown in FIGS. 20–22, described below).

A potential difference between the anode 720 and the cathode 728 causes flow of electrons through the structure in the well 728, which causes the LEP 724 to emit light. This light passes through the transparent anode 720 and the transparent substrate film 712, and out of the display device 710.

The substrate film 712 may have one or more coatings to provide a barrier against contamination of the display device 710 by oxygen and/or moisture.

A process for making the display device 710 may include forming the anodes 720 in the wells 716 by sputtering ITO followed by laser etching or by sputtering with shadow masking during the sputtering. The hole transport layer 722 and the LEP 724 may by deposited by sequential ink jet printing of PEDOT and LEP into the wells 716. Then sputter coating of the cathodes 728 is followed by placement and sealing of the back panel 730.

More broadly, manufacture of the display 710 may include the following steps: 1) microreplicate the substrate film 712 to form the ridges 714 and the wells 716; 2) sputter coat the material for the anodes 720; 3) laser etch to remove the anode material from the tops and sides of the ridges 714; 4) inkjet print the hole transport layer 722 in the wells 716; 5) inkjet print the LEP 724 in the wells 716; 6) sputter deposit the material for the cathodes 728; 7) laser etch to remove the cathode material from the tops and sides of the ridges 714 (removing excess hole transport layer material and LEP as well); 8) printing the sealant; 9) laminating the back panel 730 onto the ridges 714 by a pick and place operation; 10) curing the sealant; and 11) cutting the finished display device 710, separating it from a roll including multiple such devices. Steps 1, 2, and 3 of the above process may each be performed separately, in one or more process lines separate from the production line for the remaining process. Alternatively or in addition, the sputter coating and/or laser etching steps may be performed separately. As another alternative, the ridges 714 may be formed by printing UV-curable material, followed by UV irradiation or photolithography.

An alternative passive matrix PLED display device 810 is shown in FIG. 17. Components/features 812–830 correspond to components/features 712–730 of the display device 710 shown in FIG. 16 and described above. However, in the display device 810 the light from the LEP 824 exits the display through the front panel 830. Thus the front panel 830 and the cathode 828 are sufficiently transparent to allow light to pass therethrough. The front panel may be transparent glass. The cathode 828 may be a low work function electrode material. Examples of transparent, low work function electrodes may be found in U.S. Pat. No. 6,150,043, which is incorporated herein by reference in its entirety.

The substrate film 812 forms part of the back panel of the display device 810. The substrate film 812 may be laminated to a metal foil 840, to provide good barrier properties and enhanced reflectivity and/or contrast. The metal foil 840 may be an aluminum foil, a copper foil, or a stainless steel foil, for example.

The anode 820 need not be transparent, and may be a patterned metal electrode, such as an electrode including aluminum, copper, or ITO, for example.

Figure 18:
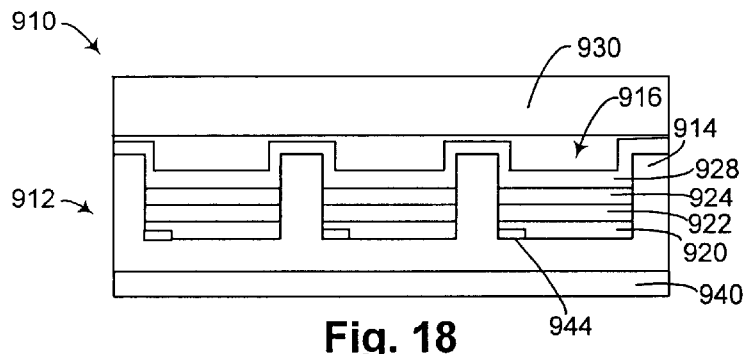
FIG. 18 is a schematic cross-sectional view of yet another alternate embodiment electroluminescent device in accordance with the present invention.

FIG. 18 shows an active matrix PLED 910. Except as discussed below, the components/features 912–940 may correspond to the components/features of the display device 810 shown in FIG. 17 and described above.

The PLED 910 includes a continuous cathode layer 928. Each of the anodes 920 has a corresponding thin film transistor (TFT) 944. The TFT 944 is used in selectively providing power to the corresponding anode 920. The TFT may be a polysilicon TFT. Alternatively, the TFT 944 may be a printed organic semiconductor TFT.

The substrate film 912 may be coated with polyimide to improve thermal resistance. Polyimide-coated films are described further in International Publication WO 00/41884, which is incorporated herein by reference in its entirety.

Steps in manufacture of the display 910 may include the following steps: 1) microreplicate the substrate film 912 to form the ridges 914 and the wells 916; 2) sputter coat the material for the anodes 920; 3) laser etch to remove the anode material from the tops and sides of the ridges 914; 4) form the TFTs 944 in the wells 916; 5) inkjet print the hole transport layer 922 in the wells 916; 6) inkjet print the LEP 924 in the wells 916; 7) sputter deposit the material for the cathodes 928; 8) printing the sealant; 9) laminating the back panel 930 onto the ridges 914 by a pick and place operation; 10) curing the sealant; and 11) cutting the finished display device 910, separating it from a roll including multiple such devices.

Figure 19:
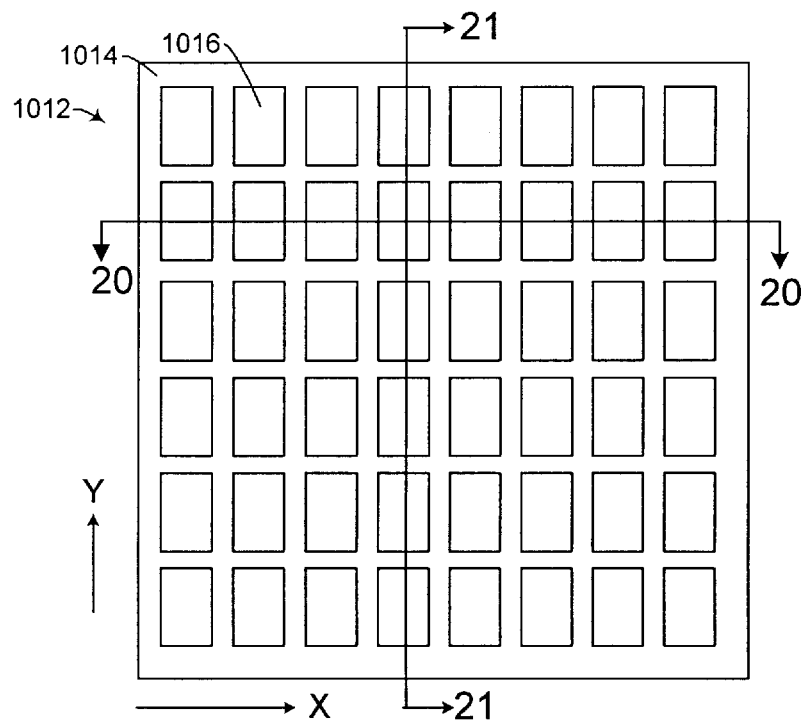
FIG. 19 is a plan view of a microreplicated substrate film in accordance with the present invention.

FIGS. 19–23 illustrate some steps of a process for making the PLED devices such as those described above. FIG. 19 shows a substrate film 1012 with wells 1016 thereupon formed by microreplication. FIGS. 20 and 21 show cross-sections of the film, showing one possible tapered shape of the ridges 1014 bounding the wells 1016.

For passive matrix displays such as those of FIGS. 16 and 17, following deposition of the anode electrode material (e.g., ITO), the electrode material is selectively etched to remove it from the shaded areas 1050 shown in FIG. 22. As discussed above, the etching may be wet etching, for example utilizing patterning by a photolithography process to achieve the desired selective etching. Alternatively, the etching may be dry etching, such as excimer laser etching.

Figure 23:
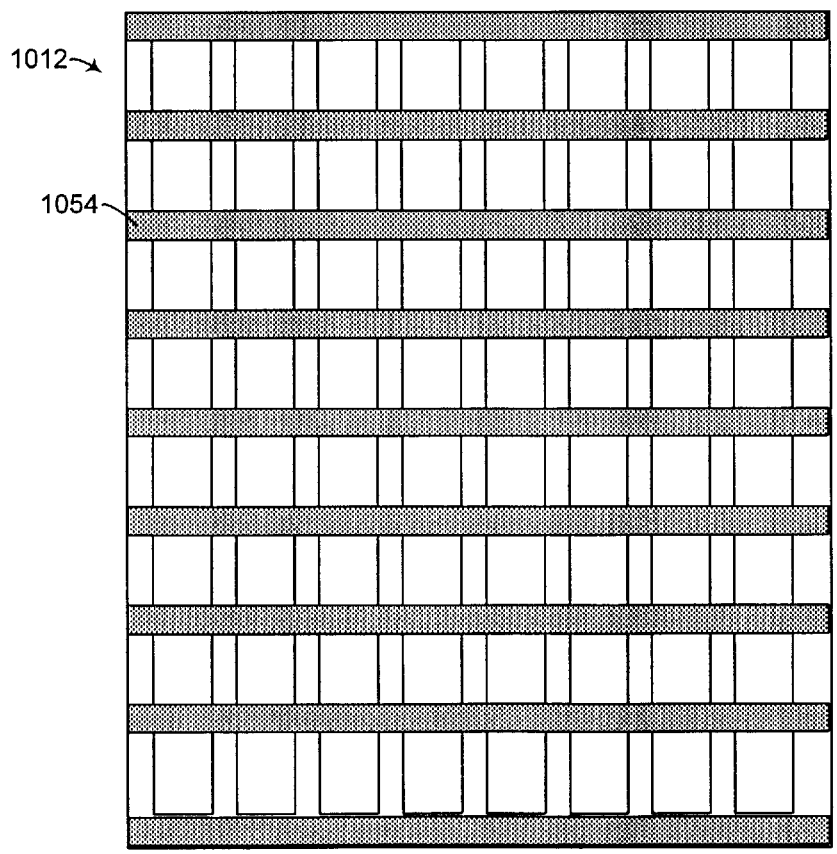
FIG. 23 is a plan view illustrating selective deposition of an insulator on the substrate film of FIG. 19.

After deposition of the hole transporting and LEP layers, such as by printing, and before depositing the cathode material, an insulator, such as $SiO_2$, may be selectively deposited, for example being deposited in the shaded areas 1054 shown in FIG. 23. The insulator may reduce the occurrence of electrical shorting in the display device.

As another alternative manufacturing method, after microreplication of a substrate film such as the substrate film 1012, the bottom of the film may be cut off, thus transforming the wells 1016 into holes through the film. Then the film may be adhered to a glass or other rigid substrate with patterned electrodes (such as ITO electrodes) already formed thereupon. It will be appreciated that the substrate film 1012 may be suitable registered so as to desirably align the holes with the patterned electrodes.

Displays of the sort described above may be coupled to other components as a part of a wide variety of devices, for display of various types of information. For example, a display may be coupled to a microprocessor, as part of a computer, electronic display device such as an electronic book, cell phone, calculator, smart card, appliance, etc., for displaying information.

It will be appreciated that the devices and methods described above have many advantages over prior art devices. For instance, as already mentioned above, the use of the pick and place device to align the front panel 12 relative to the back panel 14 allows improved accuracy in alignment. Use of a glass front substrate 22 results in a better brightness and contrast than what is presently achieved with complete plastic displays. Use of a glass front substrate 22 in combination with an opaque back panel 14 also allows for high conductivity at low cost. The glass front substrate 22 may also advantageously act as a moisture and oxygen barrier, reducing or eliminating the need for multiple transparent barrier layer films.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of producing a display comprising:
   forming a first panel having a rigid substrate;
   forming a second panel having a flexible substrate, wherein the forming includes roll forming the second panel on a web of the flexible substrate material;
   placing the first panel on the second panel;
   joining the first panel and the second panel; and
   separating the joined panels from the web.

2. The method of claim 1, wherein the placing includes using a pick and place device to hold the first panel while placing the first panel on the second panel.

3. The method of claim 2, wherein the pick and place device includes a mechanical device for holding the first panel.

4. The method of claim 2, wherein the pick and place device includes a vacuum device for holding the first panel.

5. The method of claim 2, further comprising picking up the first panel with the pick and place device, from a panel-holding magazine.

6. The method of claim 1, wherein the placing includes registering the first panel relative to the second panel.

7. The method of claim 6, wherein the registration includes optical registration.

8. The method of claim 1, wherein the joining includes bonding the panels together.

9. The method of claim 8, wherein the bonding includes spot curing an adhesive.

10. The method of claim 8, wherein the bonding further includes curing one or more sealant rings.

11. The method of claim 1, wherein the forming the panels includes forming protrusions on at least one of the substrates.

12. The method of claim 11, wherein the forming the protrusions includes forming posts.

13. The method of claim 11, wherein the forming the protrusions includes forming ribs.

14. The method of claim 11, wherein the forming the protrusions includes forming ridges surrounding each of a plurality of wells.

15. The method of claim 11, wherein the forming the protrusions includes forming protrusions with straight sides.

16. The method of claim 11, wherein the forming the protrusions includes forming protrusion with tapered sides.

17. The method of claim 11, wherein the forming the protrusions includes forming protrusions by selectively curing a curable resin.

18. The method of claim 11, wherein the forming the protrusions includes forming protrusions that are chemically and physically integral with the at least one of the substrates.

19. The method of claim 18, wherein the protrusions are formed on the flexible substrate.

20. The method of claim 19, wherein the forming the protrusions includes forming the protrusions by embossing, using a roll embosser that embosses a roll of material.

21. The method of claim 18, wherein the protrusions are formed on the rigid substrate.

22. The method of claim 21, wherein the forming the protrusions includes forming the protrusions by use of a double band press.

23. The method of claim 1, wherein one of the panels is an opaque panel and the other of the panels is a transparent panel.

24. The method of claim 23, wherein the forming the opaque panel includes forming an opaque substrate.

25. The method of claim 24, wherein the forming the opaque substrate includes printing an opaque ink as part of the opaque substrate.

26. The method of claim 24, wherein the forming the opaque substrate includes joining an opaque material layer to a transparent material layer.

27. The method of claim 26, wherein the opaque material layer and the transparent material layer are both polymer layers.

28. The method of claim 26, wherein the opaque material layer is a metallic layer.

29. The method of claim 28, wherein the joining the material layers includes laminating the layers together with a primer layer therebetween.

30. The method of claim 29, wherein the primer layer includes an acrylic coating.

31. The method of claim 1, wherein the first panel is a front panel, and the second panel is a back panel.

32. The method of claim 1, wherein the first panel is a back panel and the second panel is a front panel.

33. The method of claim 1, further comprising, prior to the placing, covering one of the substrates with an electrode material layer, and patterning the electrode material layer.

34. The method of claim 33, wherein the electrode material includes a transparent electrode material.

35. The method of claim 34, wherein the transparent electrode material includes indium tin oxide.

36. The method of claim 34, wherein the transparent electrode material includes silver or an alloy thereof.

37. The method of claim 33, wherein the electrode material includes an opaque electrode material.

38. The method of claim 33, wherein the patterning the electrode material includes ablating the electrode material with laser light.

39. The method of claim 38, further comprising, prior to the covering, depositing a thermal protective layer upon which the electrode layer is deposited.

40. The method of claim 39, wherein the depositing the thermal protective layer includes depositing a polymer material.

41. The method of claim 39, wherein the depositing the thermal protective layer includes depositing an acrylic layer.

42. The method of claim 33, wherein the coating with the electrode material includes sputter coating the electrode material onto the substrate.

43. The method of claim 33, further comprising, after the patterning the electrode material, depositing a light emitting material on the patterned electrodes.

44. The method of claim 43, wherein the depositing the light emitting material includes depositing a hole transport layer.

45. The method of claim 44, wherein the depositing the hole transport layer includes printing the hole transport layer.

46. The method of claim 45, wherein the printing the hole transport layer includes inkjet printing the hole transport layer.

47. The method of claim 44, wherein the depositing the light emitting material includes depositing an emitter.

48. The method of claim 47, wherein the depositing the emitter includes depositing a light emitting polymer.

49. The method of claim 47, wherein the depositing the emitter includes printing the emitter.

50. The method of claim 47, wherein the depositing the light emitting material further includes depositing an electron transport material.

51. The method of claim 43, further comprising depositing another electrode layer, with the light emitting material between the electrode layers.

52. The method of claim 51, wherein the depositing the another electrode layer includes sputter depositing electrode material.

53. The method of claim 51, further comprising selectively removing electrode material from the another electrode layer.

54. The method of claim 53, wherein the selectively removing includes laser etching the another electrode layer.

55. The method of claim 51, further comprising depositing an insulator on the light emitting material prior to depositing the another electrode layer.

56. The method of claims 33, further comprising covering the other substrate with another electrode material layer, and patterning the another electrode material layer.

57. The method of claim 56, wherein the electrode material layer and the another electrode material layer include the same electrode material.

58. The method of claim 56, wherein the electrode material layer and the another electrode material layer include different electrode materials.

59. The method of claim 56, further comprising depositing respective alignment layers on the electrode material layers, and placing a liquid crystal material between the alignment layers.

60. The method of claim 59, wherein the depositing the alignment layers includes printing a least one of the alignment layers.

61. The method of claim 59, wherein the placing the liquid crystal material includes printing the liquid crystal material on one of the panels prior to joining the panels.

62. The method of claim 61, wherein the inserting the liquid crystal material through a seal ring gap.

63. The method of claim 62, further comprising, after the inserting, sealing the seal ring gap.

64. The method of claim 59, wherein the placing the liquid crystal material includes inserting the liquid crystal material between the panels.

65. The method of claim 64, wherein the inserting the liquid crystal material occurs after the separating the combined panels from the web.

66. The method of claim 1, wherein the rigid substrate is a glass substrate.

67. The method of claim 1, wherein the rigid substrate is a plastic substrate.

68. The method of claim 1, wherein the forming the second panel includes embedding driving electronics in the flexible substrate.

69. The method of claim 68, wherein the driving electronics include microstructure elements.

70. The method of claim 68, wherein the driving electronics include thin film transistors.

\* \* \* \* \*